(12) United States Patent
Shibazaki

(10) Patent No.: US 8,693,006 B2
(45) Date of Patent: Apr. 8, 2014

(54) REFLECTOR, OPTICAL ELEMENT, INTERFEROMETER SYSTEM, STAGE DEVICE, EXPOSURE APPARATUS, AND DEVICE FABRICATING METHOD

(75) Inventor: Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 42 days.

(21) Appl. No.: 11/475,034

(22) Filed: Jun. 27, 2006

(65) Prior Publication Data

US 2007/0008548 A1  Jan. 11, 2007

(30) Foreign Application Priority Data

Jun. 28, 2005 (JP) .................. 2005-188228
Jun. 28, 2005 (JP) .................. 2005-188269

(51) Int. Cl.
*G01B 9/02* (2006.01)
(52) U.S. Cl.
USPC .............................................. 356/500
(58) Field of Classification Search
USPC ......... 356/486, 482, 487, 488, 493, 494, 498, 356/499, 500
See application file for complete search history.

(56) References Cited

U.S. PATENT DOCUMENTS

| | | |
|---|---|---|
| 3,790,284 A | 2/1974 | Baldwin |
| 4,677,301 A | 6/1987 | Tanimoto et al. |
| 4,710,026 A | 12/1987 | Magome et al. |
| 4,787,747 A | 11/1988 | Sommargren et al. |
| 4,836,678 A | 6/1989 | Okaji |
| 5,066,990 A | 11/1991 | Rippel |
| 5,243,195 A | 9/1993 | Nishi |
| 5,528,118 A | 6/1996 | Lee |
| 5,623,853 A | 4/1997 | Novak et al. |
| 5,646,413 A | 7/1997 | Nishi |
| 5,757,160 A | 5/1998 | Kreuzer |
| 5,757,491 A | 5/1998 | Cai et al. |
| 5,874,820 A | 2/1999 | Lee |
| 5,969,441 A | 10/1999 | Loopstra et al. |
| 6,020,964 A * | 2/2000 | Loopstra et al. .............. 356/500 |
| 6,144,397 A | 11/2000 | Chiba et al. |
| 6,208,407 B1 | 3/2001 | Loopstra |
| 6,285,457 B2 | 9/2001 | Ukaji |
| 6,341,007 B1 | 1/2002 | Nishi et al. |
| 6,400,441 B1 | 6/2002 | Nishi et al. |

(Continued)

FOREIGN PATENT DOCUMENTS

EP   1 780 786 A1   5/2007
EP   1 791 165 A1   5/2007

(Continued)

OTHER PUBLICATIONS

English-language translation of International Search Report mailed Oct. 10, 2006 for International Application No. PCT/JP2006/312880.

(Continued)

*Primary Examiner* — Hwa Lee
(74) *Attorney, Agent, or Firm* — Oliff PLC

(57) ABSTRACT

A reflecting member has: a first reflecting surface, which extends in a second direction that includes a first direction component; a second reflecting surface, which extends in a third direction that includes the first direction component, that is substantially symmetric to the first reflecting surface; and a third reflecting surface, which extends in a fourth direction, that is substantially orthogonal to the first direction.

13 Claims, 23 Drawing Sheets

(56) References Cited

U.S. PATENT DOCUMENTS

| | | | |
|---|---|---|---|
| 6,549,269 | B1 | 4/2003 | Nishi et al. |
| 6,570,641 | B2 | 5/2003 | Hamada et al. |
| 6,590,634 | B1 | 7/2003 | Nishi et al. |
| 6,650,419 | B2 | 11/2003 | Hill |
| 6,778,257 | B2 | 8/2004 | Bleeker et al. |
| 6,808,115 | B2 * | 10/2004 | Alves et al. ............... 235/462.39 |
| 6,819,433 | B2 * | 11/2004 | Takai et al. .................... 356/500 |
| 6,867,849 | B2 | 3/2005 | Iwamoto et al. |
| 6,876,452 | B2 | 4/2005 | Evans et al. |
| 7,130,056 | B2 * | 10/2006 | Schluchter et al. ........... 356/500 |
| 7,362,447 | B2 * | 4/2008 | Schluchter ................... 356/500 |
| 2002/0018192 | A1 | 2/2002 | Nishi |
| 2002/0163741 | A1 | 11/2002 | Shibazaki |
| 2004/0047027 | A1 | 3/2004 | Carlson |
| 2005/0111005 | A1 | 5/2005 | Eussen et al. |
| 2005/0185193 | A1 | 8/2005 | Schluchter et al. |
| 2005/0259268 | A1 | 11/2005 | Schluchter |

FOREIGN PATENT DOCUMENTS

| | | |
|---|---|---|
| EP | 1 811 526 A1 | 7/2007 |
| JP | U-58-45502 | 3/1983 |
| JP | U-60-47647 | 4/1985 |
| JP | A 60-130742 | 7/1985 |
| JP | A 61-215905 | 9/1986 |
| JP | A 05-21314 | 1/1993 |
| JP | A 07-176468 | 7/1995 |
| JP | A 08-166475 | 6/1996 |
| JP | A 08-330224 | 12/1996 |
| JP | A 10-163099 | 6/1998 |
| JP | A 10-166167 | 6/1998 |
| JP | A-10-170217 | 6/1998 |
| JP | A 10-214783 | 8/1998 |
| JP | A 11-135400 | 5/1999 |
| JP | A 11-183122 | 7/1999 |
| JP | A 2000-505958 | 5/2000 |
| JP | A 2001-510577 | 7/2001 |
| JP | A 2001-345254 | 12/2001 |
| JP | A 2004-165417 | 6/2004 |
| JP | A 2004-168481 | 6/2004 |
| JP | A 2004-215434 | 7/2004 |
| JP | A 2005-005329 | 1/2005 |
| JP | A 2005-120187 | 5/2005 |
| KR | 10-2001-0024070 | 3/2001 |
| WO | WO 99/23692 | 5/1999 |
| WO | WO 99/28790 | 6/1999 |
| WO | WO 01/35168 A1 | 5/2001 |
| WO | WO 03/019112 A1 | 3/2003 |
| WO | WO 2004/053958 A1 | 6/2004 |
| WO | WO 2005/122242 A1 | 12/2005 |
| WO | WO 2006/009254 A1 | 1/2006 |
| WO | WO 2006/013856 A1 | 2/2006 |

OTHER PUBLICATIONS

English language translation of JP-U-58-45502 published Mar. 26, 1983.

English language translation of JP-U-60-47647 published Apr. 3, 1985.

European Search Report issued in counterpart European Patent Application No. 06767497.8 on Aug. 11, 2010.

Written Opinion issued in related PCT Application No. PCT/JP2006/312880 on Oct. 10, 2006 (with translation).

Dec. 23, 2011 partial European Search Report in European Patent Application No. 11 15 9534.4.

Feb. 21, 2012 Office Action in Japanese Application No. 2007-523973.

Japanese Patent Office, Notice of Reasons for Rejection mailed Feb. 21, 2012 in Japanese Patent Application No. 2007-523973 w/English-language Translation.

Aug. 1, 2012 European Search Report issued in EP 11 15 9534.4.

Aug. 1, 2012 Office Action issued in Korean Patent Application No. 2007-7021208 (with translation).

Jun. 28, 2013 Office Action issued in Taiwanese Patent Application No. 095123334.

English translation of Jun. 28, 2013 Office Action issued in Taiwanese Patent Application No. 095123334.

* cited by examiner

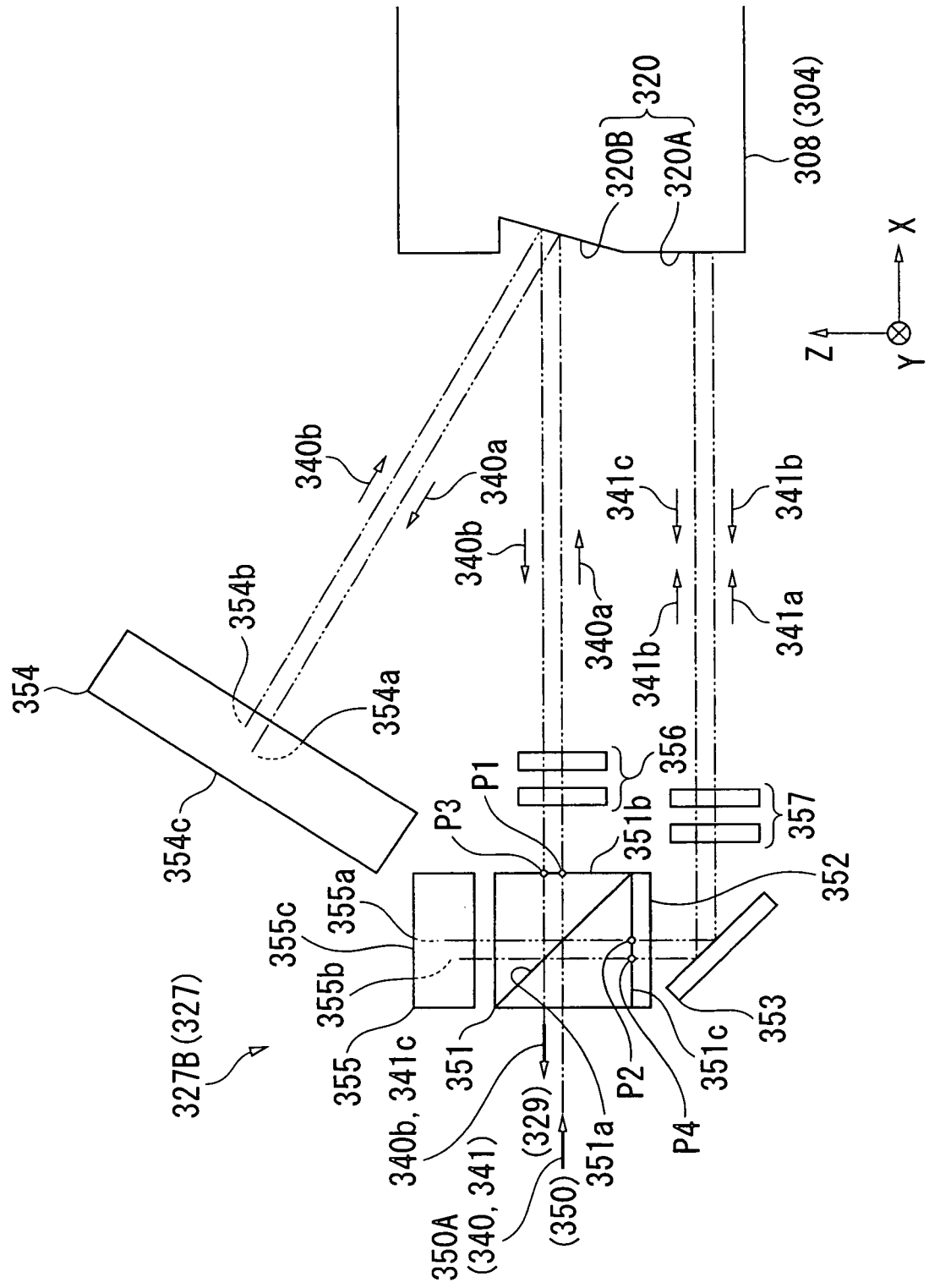

FIG. 17
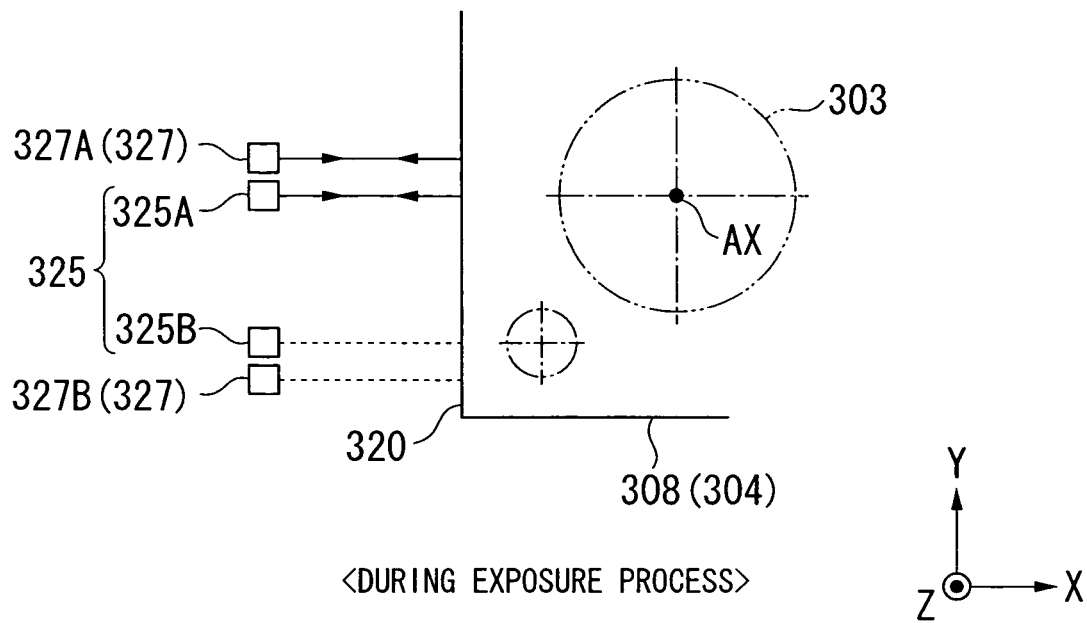
<DURING EXPOSURE PROCESS>
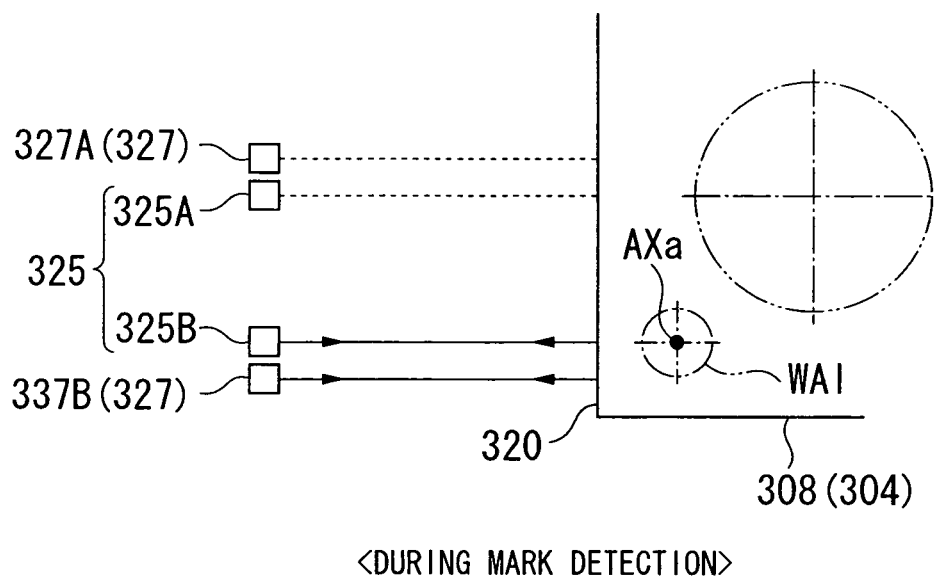
<DURING MARK DETECTION>

REFLECTOR, OPTICAL ELEMENT, INTERFEROMETER SYSTEM, STAGE DEVICE, EXPOSURE APPARATUS, AND DEVICE FABRICATING METHOD

CROSS-REFERENCE TO RELATED APPLICATION

The disclosure of each of the following priority applications is hereby incorporated by reference in its entirety: Japanese Patent Application Nos. 2005-188228 and 2005-188269, both filed on Jun. 28, 2005.

BACKGROUND OF THE INVENTION

1. Field of the Invention

The present invention relates to a reflector, an optical element, an interferometer system, a stage device, an exposure apparatus, and a device fabricating method.

2. Description of Related Art

In a process of fabricating an electronic device, such as a semiconductor device or a liquid crystal display device, a projection exposure apparatus is used that projects a pattern image of a mask or a reticle (hereinafter, generically referred to as a reticle), wherein a pattern is formed through a projection optical system onto each projection region (shot region) on a substrate (such as a wafer or a glass plate), which is coated with a photosensitive material (resist).

With such an exposure apparatus, the positional information of the stage, whereon the substrate is mounted, is measured by an interferometer system. The interferometer system irradiates a beam to a reflecting mirror (movable mirror), which is provided to the stage, and uses that reflected beam to measure the positional information of the stage (for example, refer to Published Japanese Translation No. 2001-510577 of the PCT International Publication, and the corresponding U.S. Pat. No. 6,020,964). In addition, a technology has been proposed that uses the interferometer system to measure a position (height position) of the stage in the optical axis direction of the projection optical system (for example, refer to Japanese Published Unexamined Patent Application No. 2001-345254 and the corresponding U.S. Pat. No. 6,867, 849). According to this technology, it is possible to improve the speed of response and to accurately measure the position of the stage in the height direction, even if the substrate is not mounted or if the stage has moved to an area where the substrate is not present.

With a constitution wherein a reflecting plate is provided above a movable stage, it is difficult to secure a location for installing downflow equipment. In addition, if a measuring instrument, which is used to measure the position of the projection optical system and the wafer, is disposed above the movable stage in order to avoid the reflecting plate, then there is a risk that this will invite an increase in the size of the apparatus.

In addition, with a conventional interferometer system for height position measurement, the beam is bent at a prescribed angle by a reflecting mirror (movable mirror) provided to the stage, is reflected by a reflecting mirror (fixed mirror), which is fixed to a stationary object, and then returns along the original path. With such an interferometer system, the optical path length of the beam is comparatively long, and changes in the attitude of the stage therefore tend to affect the measurement result. For example, a change in the inclination of the stage results in a comparatively large positional deviation of the beam that returns from the stage and/or a comparatively large angular deviation in the return direction, and there is consequently a possibility that this will invite a detection failure and/or measurement error.

SUMMARY OF THE INVENTION

It is an object of the present invention to provide: a reflecting member that makes it possible to detect the position of a movable stage without inviting an increase in the size of an apparatus; a stage apparatus comprising that reflecting member; and an exposure apparatus. It is another object of the present invention to enable an interferometer system that measures height position to reduce the incidence of detection failures and measurement error with respect to changes in the attitude of a movable body, and to perform high precision position measurement.

According to an first aspect of the invention, a reflecting member is provided, comprising: a first reflecting surface that extends in a second direction, which includes a first direction component; a second reflecting surface that extends in a third direction, which includes the first direction component, and is substantially symmetric to the first reflecting surface; and a third reflecting surface that extends in a fourth direction substantially orthogonal to the first direction.

According to a first aspect of the invention, if a measurement target provided by the reflecting member is displaced in the first direction, then the optical path length of the beam reflected by the first reflecting surface and the optical path length of the beam reflected by the second reflecting surface change in accordance with the displacement of the measurement target in the first direction, and it is consequently possible to measure positional information of the measurement target in the first direction by measuring the displacements of these optical path lengths. Consequently, there is no need to provide the reflecting member above the stage, it is possible to install downflow equipment without being limited by the position of the reflecting member, and it is also possible to avoid a needless increase in the size of the apparatus. In addition, according to this first aspect of the invention, if the measurement target provided by the reflecting member is displaced in a fifth direction, which intersects the fourth direction, then the optical path length of the beam reflected by the third reflecting surface changes in accordance with the displacement of the measurement target in the fifth direction, and it is consequently possible to measure positional information of the measurement target in the fifth direction by measuring the displacement of this optical path length.

According to a second aspect of the invention, a stage apparatus is provided, comprising: a movable stage that moves in a plane of motion; a first reflecting member that comprises: a first reflecting surface, which extends in a second direction that includes a component of a first direction, that is substantially orthogonal to the plane of motion; and a second reflecting surface, which extends in a third direction that includes the first direction component, that is substantially symmetric to the first reflecting surface; and is provided to the movable stage; and a measuring apparatus that measures positional information of the movable stage in the first direction based on a first beam, which is reflected by the first reflecting surface, and a second beam, which is reflected by the second reflecting surface.

According to a second aspect of the invention, if the movable stage is displaced in the first direction, then the optical path length of the beam that was reflected by the first reflecting surface of the first reflecting member and the optical path length of the beam that was reflected by the second reflecting surface change in accordance with the displacement of the movable stage in the first direction, which consequently makes it possible to measure positional information of the movable stage in the first direction by measuring the displacements of these optical path lengths. Consequently, there is no longer a need to provide the first reflecting member above the stage, and it is possible to avoid a needless increase in the size of the apparatus, which is no longer limited by the position of a fixed mirror.

According to a third aspect of the invention, an exposure apparatus is provided that exposes a pattern onto a substrate using a stage apparatus, wherein a stage apparatus as previously recited is used as the stage apparatus.

According to a third aspect of the invention, it is possible to measure positional information of the substrate via a movable stage while avoiding an increase in the size of the apparatus.

According to a fourth aspect of the invention, an interferometer system is provided, comprising: an interferometer that irradiates a measuring beam and a reference beam in a first direction toward a movable body, and measures positional information of the movable body in the second direction, which intersects the first direction; a first reflecting part, which is provided to the movable body, reflects the measuring beam and the reference beam, and bends the measuring beam by a prescribed angle from the first direction to the second direction; and a second reflecting part that shifts the optical axis of the measuring beam from the first reflecting part, and returns the measuring beam to the first reflecting part.

According to a fourth aspect of the invention, the measuring beam is reflected twice at both the first reflecting part and the second reflecting part, which prevents angular deviation in the return direction of the measuring beam. Furthermore, the optical axis of the measuring beam is shifted by the second reflecting part, which shortens the optical path length of the measuring beam, and, as a result, suppresses deviation of the return position of the measuring beam. Consequently, according to the fourth aspect of the invention, it is possible to reduce measurement error and the incidence of detection failures with respect to changes in the attitude of the movable body.

According to a fifth aspect of the invention, an interferometer system is provided that irradiates a measuring beam to a movable body and measures positional information of the movable body in a direction that intersects the irradiation direction, wherein the measurement sensitivity decreases with respect to a change in the inclination of the movable body about the irradiation direction or the measurement direction.

According to a fifth aspect of the invention, measurement sensitivity is low with respect to changes in the inclination of the movable body about the irradiation direction or the measurement direction of the measuring beam, and it is therefore possible to reduce measurement error and the incidence of detection failures with respect to changes in the attitude of the movable body.

According to a sixth aspect of the invention, an optical member is provided, comprising: a polarizing surface that splits an entrance beam into a first beam and a second beam in accordance with the polarization state thereof; a first surface, wherefrom the first beam split by the polarizing surface emerges; a second surface, wherefrom the second beam split by the polarizing surface emerges; a reflecting member that reflects a third beam, which is incident from the second surface, and is provided so that the third beam emerges from a position that differs from an emergent position of the second beam at the second surface; a first polarization switching member, which is disposed along the optical path of the second beam after it has been split by the polarizing surface, that switches the polarization state of the second beam; and a second polarization switching member, which is disposed along the optical path of the third beam after it has emerged from the second surface, that switches the polarization state of the third beam; wherein, a fourth beam, which enters from the emergent position of the third beam at the second surface, and a fifth beam, which enters from a position that differs from the emergent position of the first beam at the first surface, proceed along substantially the same optical path.

According to a sixth aspect of the invention, the first beam and the second beam mutually interfere by entering a first surface or a second surface from positions that differ from the initial emergent positions. Accordingly, the sixth aspect is preferably used in an interferometer that has a function that uses the shifting of the optical axis to reduce measurement error and the incidence of detection failures with respect to changes in the attitude of the movable body.

BRIEF DESCRIPTION OF THE DRAWINGS

FIG. 13 is a schematic side view that shows the constitution of the interferometer optical system.

FIG. 17 is for the purpose of explaining an aspect wherein a plurality of interferometer optical systems is switched in the interferometer system.

DETAILED DESCRIPTION OF THE INVENTION

The following explains the embodiments of the present invention, referencing FIG. 1 through FIG. 23.

First, the following explains an embodiment wherein a stage apparatus according to the present invention is adapted to a wafer stage of an exposure apparatus, and a reflecting member according to the present invention is provided to the wafer stage.

Figure 1:
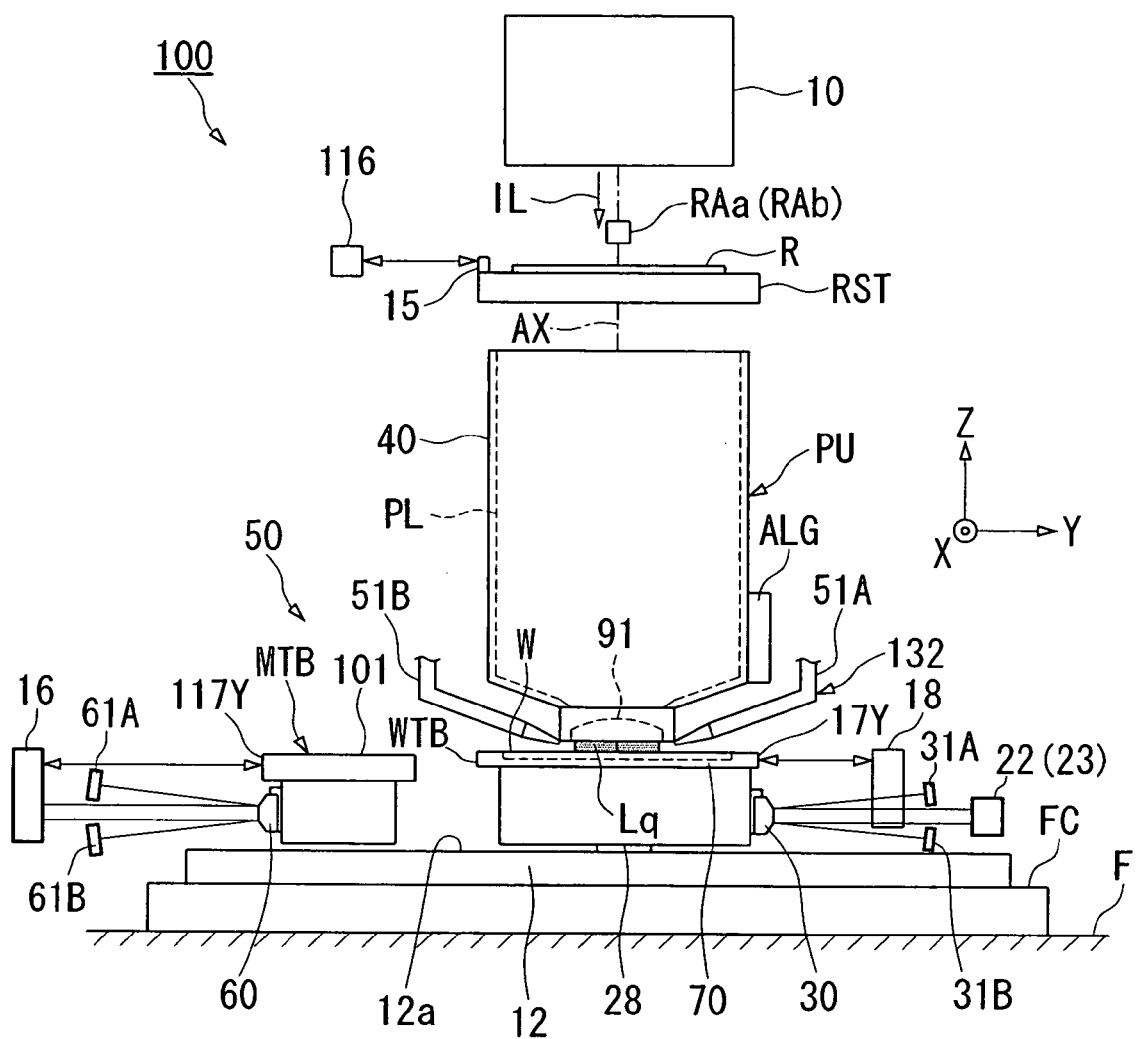
FIG. 1 is a schematic block diagram that shows an exposure apparatus according to one embodiment.

FIG. 1 shows a schematic block diagram of an exposure apparatus 100 of the present embodiment. The exposure apparatus 100 is a step-and-scan type projection exposure apparatus, i.e., a so-called scanning stepper. The exposure apparatus 100 comprises: an illumination system 10; a reticle stage RST that holds a reticle R, which serves as a mask; a projection unit PU; a stage apparatus 50, which comprises a wafer stage WST and a measurement stage MST; and a control system therefore. A wafer W is mounted on the wafer stage WST.

First, the stage apparatus 50 will be explained. The stage apparatus 50 comprises: a frame caster FC; a base plate 12, which is provided on the frame caster FC; the wafer stage WST and the measurement stage MST, which are disposed above the base plate 12 and move along an upper surface 12a thereof; an interferometer system 118 (refer to FIG. 8), which includes interferometers 16, 18 that detect the positions of the stages WST, MST; and a stage drive part 124 (refer to FIG. 8) that drives the stages WST, MST.

Figure 2:
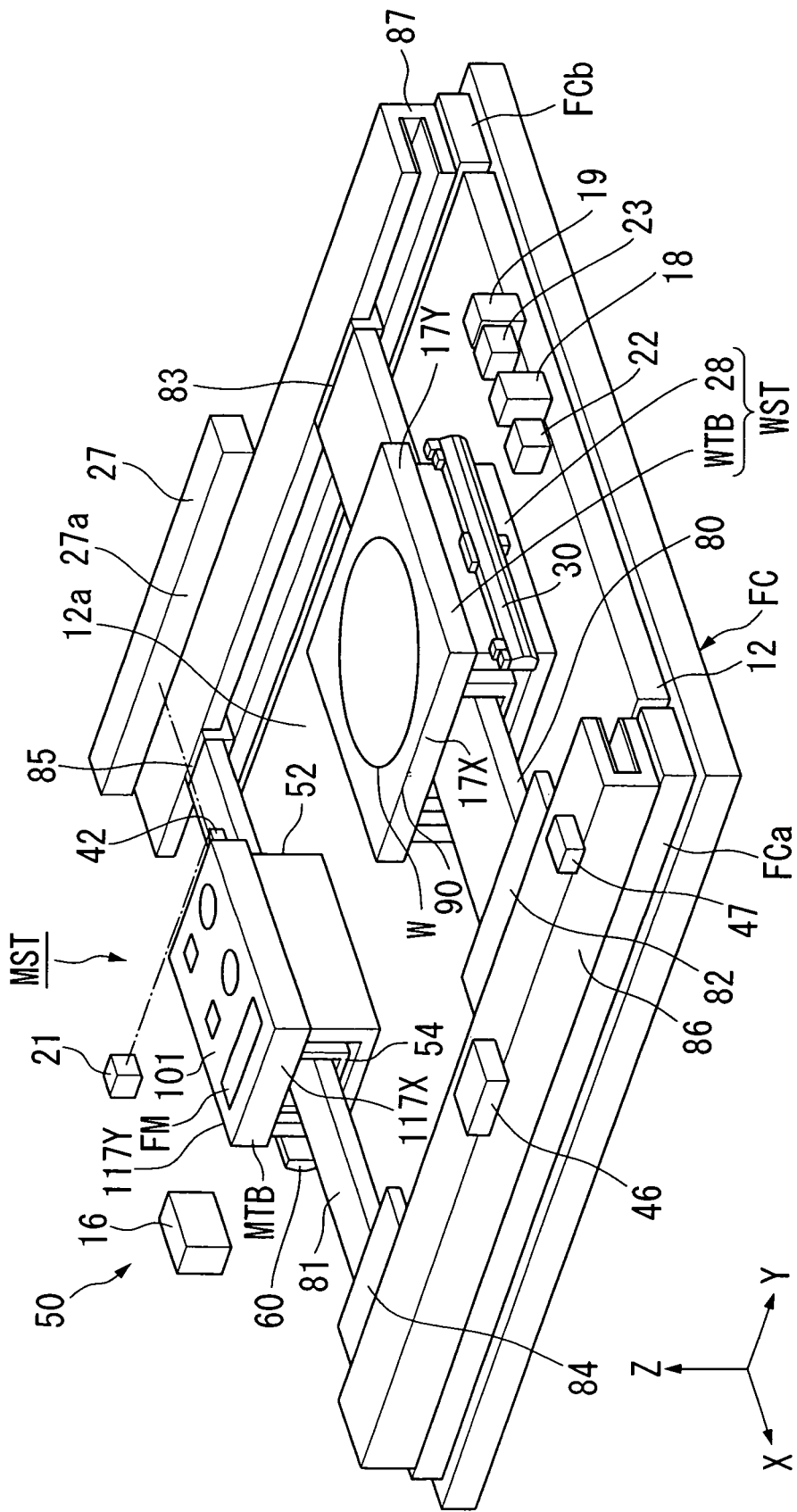
FIG. 2 is an oblique view of a stage apparatus.

As shown in FIG. 2, the substantially plate shaped frame caster FC comprises upwardly protruding parts FCa, FCb, which are integrally formed in the vicinity of both end parts of the frame caster FC in the X axial direction, that are oriented so that the longitudinal direction is in the Y axial direction. Stators 86, 87, which are for the Y axis drive and extend in the Y axial direction, are provided and disposed above the protruding parts FCa, FCb of the frame caster FC, as shown in FIG. 2. These Y axis stators 86, 87 are levitationally supported with a prescribed clearance on the upper surface of each of the protruding parts FCa, FCb by aerostatic bearings (not shown), e.g., air bearings, which are provided to the lower surface of each of the stators 86, 87. This is because the reaction force generated by the movement of the wafer stage WST and/or the measurement stage MST in the Y direction moves the stators 86, 87 in the reverse direction as countermasses, and this reaction force is offset by the law of conservation of momentum. In the present embodiment, the Y axis stators 86, 87 each comprise a magnet unit, which are composed of a plurality of permanent magnet groups.

The base plate 12 is disposed above the area that is interposed by the protruding parts FCa, FCb of the frame caster FC. The upper surface 12a of the base plate 12 is finished with an extremely high degree of flatness and forms a guide surface when the wafer stage WST and the measurement stage MST move along the XY plane.

As shown in FIG. 2, the wafer stage WST comprises a wafer stage main body 28, which is disposed on the base plate 12, and a wafer table WTB, which is mounted via a Z tilt drive mechanism (not shown) on the wafer stage main body 28. Actually, the Z tilt drive mechanism comprises three actuators (e.g., voice coil motors and EI cores) that support the wafer table WTB on the wafer stage main body 28 at three points. The Z tilt drive mechanism finely drives the wafer table WTB in the directions of the three degrees of freedom, i.e., the Z axial direction, the θX direction (rotational direction about the X axis), and the θY direction (rotational direction about the Y axis), by adjusting the drive of each of the actuators.

The wafer stage main body 28 comprises a hollow member, which is rectangularly frame shaped in its cross section and extends in the X axial direction. A self weight canceling mechanism, such as the one recited in Japanese Patent Application No. 2004-215434 (corresponding PCT International Publication WO 2006/009254) previously filed by the present applicant, is provided to the lower surface of the wafer stage main body 28. The self weight canceling mechanism comprises: a support part, which supports the wafer stage WST by applying internal pressure to a bellows; and an air bearing part that opposed the guide surface 12a and levitates the wafer stage WST thereon.

A magnet unit 90, which comprises permanent magnet groups that serve as a slider in the X axial direction, is provided inside the wafer stage main body 28. An X axis stator 80, which extends in the X axial direction, is inserted in an internal space of the magnet unit 90. This X axis stator 80 comprises an armature unit, wherein a plurality of armature coils are built in and disposed at prescribed intervals along the X axial direction. In this case, the magnet unit 90 and the X axis stator 80, which comprises the armature unit, constitute a moving magnet type X axis linear motor that drives the wafer stage WST in the X axial direction. The abovementioned X axis linear motor shall generically be called the X axis linear motor 80 and will use the same symbol as the stator (X axis stator) 80. Furthermore, a moving coil type linear motor may be used as the X axis linear motor 80 in place of the moving magnet type linear motor.

Sliders 82, 83, which each comprise an armature unit wherein, for example, a plurality of armature coils are built in and disposed at prescribed intervals along the Y axial direction, are fixed to the end parts on both sides of the X axis stator 80 in the longitudinal direction, one on each side. Each of these sliders 82, 83 is inserted in each of the Y axis stators 86, 87, which were discussed above, respectively, from the inner side. Namely, in the present embodiment, the sliders 82, 83, which each comprise an electric unit, and the Y axis stators 86, 87, which each comprise a magnet unit, constitute a moving coil type Y axis linear motor that drives the wafer stage WST in the Y axial direction. Hereinbelow, the abovementioned two Y axis linear motors are generically referred to as the Y axis linear motors 82, 83, and use the same symbols as the sliders 82, 83. Furthermore, moving magnet type linear motors may be used as the Y axis linear motors 82, 83 in place of the moving coil type linear motors.

The wafer stage WST is driven in the X axial direction by the X axis linear motor 80, and in the Y axial direction integrally therewith by the pair of Y axis linear motors 82, 83. In addition, the wafer stage WST is rotationally driven in the θZ direction (rotational direction about the Z axis) by slightly varying the driving force generated by each of the Y axis linear motors 82, 83 in the Y axial direction. Accordingly, the wafer table WTB can be finely driven without contact in each direction (X, Y, Z, θX, θY, θZ) of the six degrees of freedom by driving the three actuators, which support the wafer table WTB, the X axis linear motor 80, and the Y axis linear motors 82, 83. The wafer table WTB may be directly driven in the directions of the six degrees of freedom by increasing the number of actuators connected thereto.

A wafer holder (not shown), which holds the wafer W, is provided on the wafer table WTB. The wafer holder comprises a plate shaped main body part and a liquid repellent (water repellent) auxiliary plate, wherein a circular aperture whose diameter is larger than that of the wafer W is formed at its center, that is fixed to the upper surface of the main body part. Numerous (plural) pins are disposed in an area of the main body part inside the circular aperture of the auxiliary plate. The numerous pins vacuum chuck the wafer W in a supported state. In this state, wherein the wafer W is vacuum chucked, the height of the front surface of the wafer W and the front surface of the auxiliary plate are substantially the same.

Furthermore, liquid repellency may be imparted to the front surface of the wafer table WTB without providing the auxiliary plate.

In addition, as shown in FIG. 2, a reflecting surface 17X, which is orthogonal to the X axial direction (i.e., extends in the Y axial direction) is formed by mirror surface processing at one end (+X side end) of the wafer table WTB in the X axial direction. Likewise, a reflecting surface 17Y, which is orthogonal to the Y axial direction (i.e., extends in the X axial direction) is formed by mirror surface processing at one end (+Y side end) of the wafer table WTB in the Y axial direction. Interferometer beams from X axis interferometers 46, 47, which constitute the interferometer system 118 (refer to FIG. 8) discussed later, are projected to the reflecting surface 17X. Interferometer beams from Y axis interferometers 18, 19, which constitute the interferometer system 118 (refer to FIG. 8) discussed later, are projected to the reflecting surface 17Y. The interferometers 46, 47, 18, 19 receive these reflected beams and thereby detect the displacement in the measurement direction from a reference position of each of the reflecting surfaces 17X, 17Y (generally, a fixed mirror is disposed on a side surface of the projection unit PU and/or a side surface of an off axis alignment system ALG—refer to FIG. 1 and FIG. 8—and such is used as a reference surface).

Figure 3:
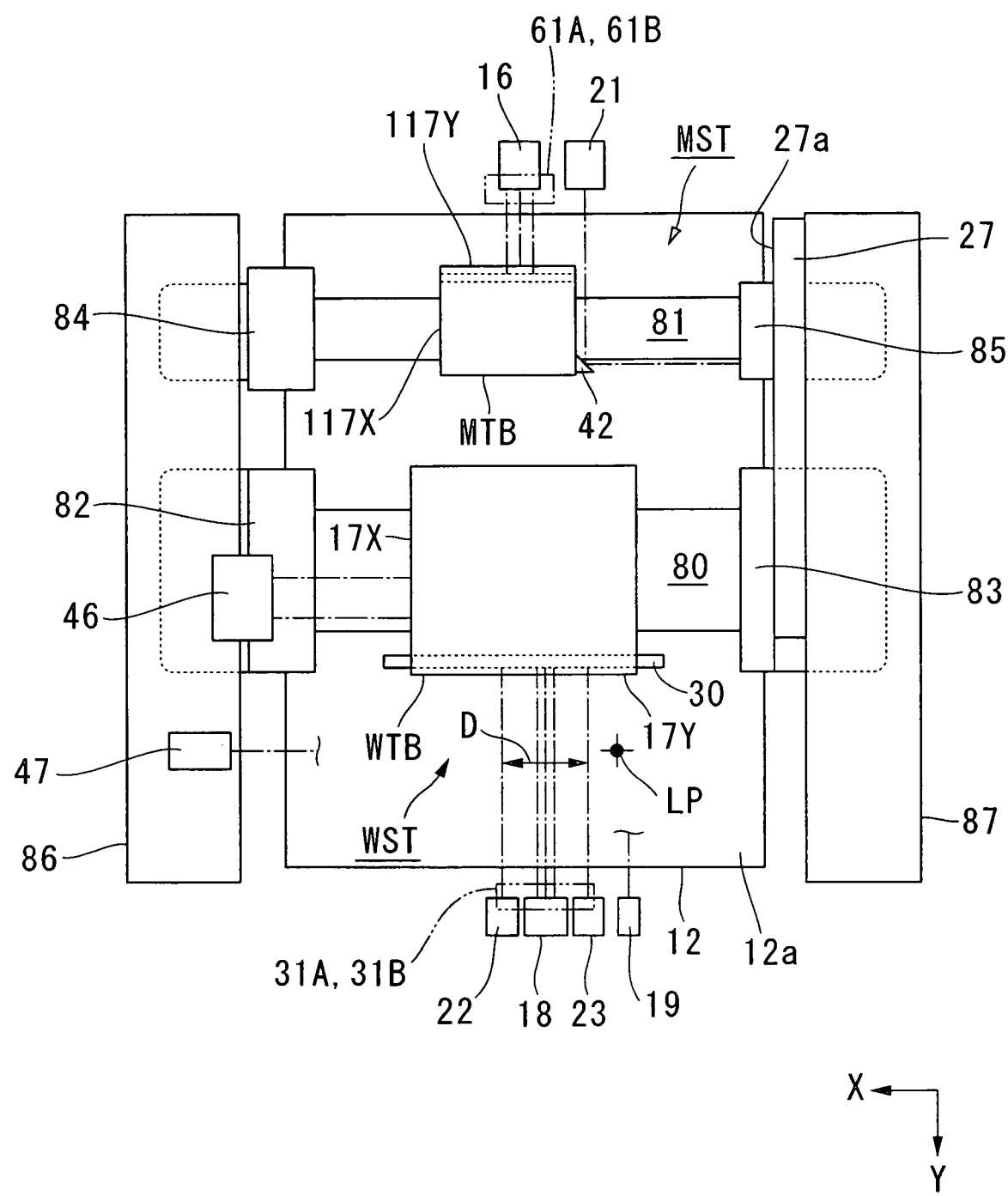
FIG. 3 is a plan view of the same stage apparatus.

Likewise, the displacement of the measurement stage MST is detected by projecting interferometer beams from the abovementioned X axis interferometer 46 and Y axis interferometer 16, which constitute the interferometer system 118; however, if the measurement stage MST is at a position outside of the range of detection of the X axis interferometer 46, then the displacement of the measurement stage MST is detected by an X axis interferometer 21. Namely, as shown in FIG. 2 and FIG. 3, a mirror 42, which bends the interferometer beam irradiated along the Y axial direction from the interferometer 21 to the X axial direction, is mounted on a side part of the measurement stage MST. The interferometer beam bent by the mirror 42 is reflected by a reflecting member 27, which is provided above the stator 87 separately therefrom and comprises a reflecting surface 27a that is parallel to the YZ plane. The interferometer 21 detects the displacement of the measurement stage MST in the X axial direction by receiving the interferometer beam reflected by the reflecting member 27.

Figure 4:
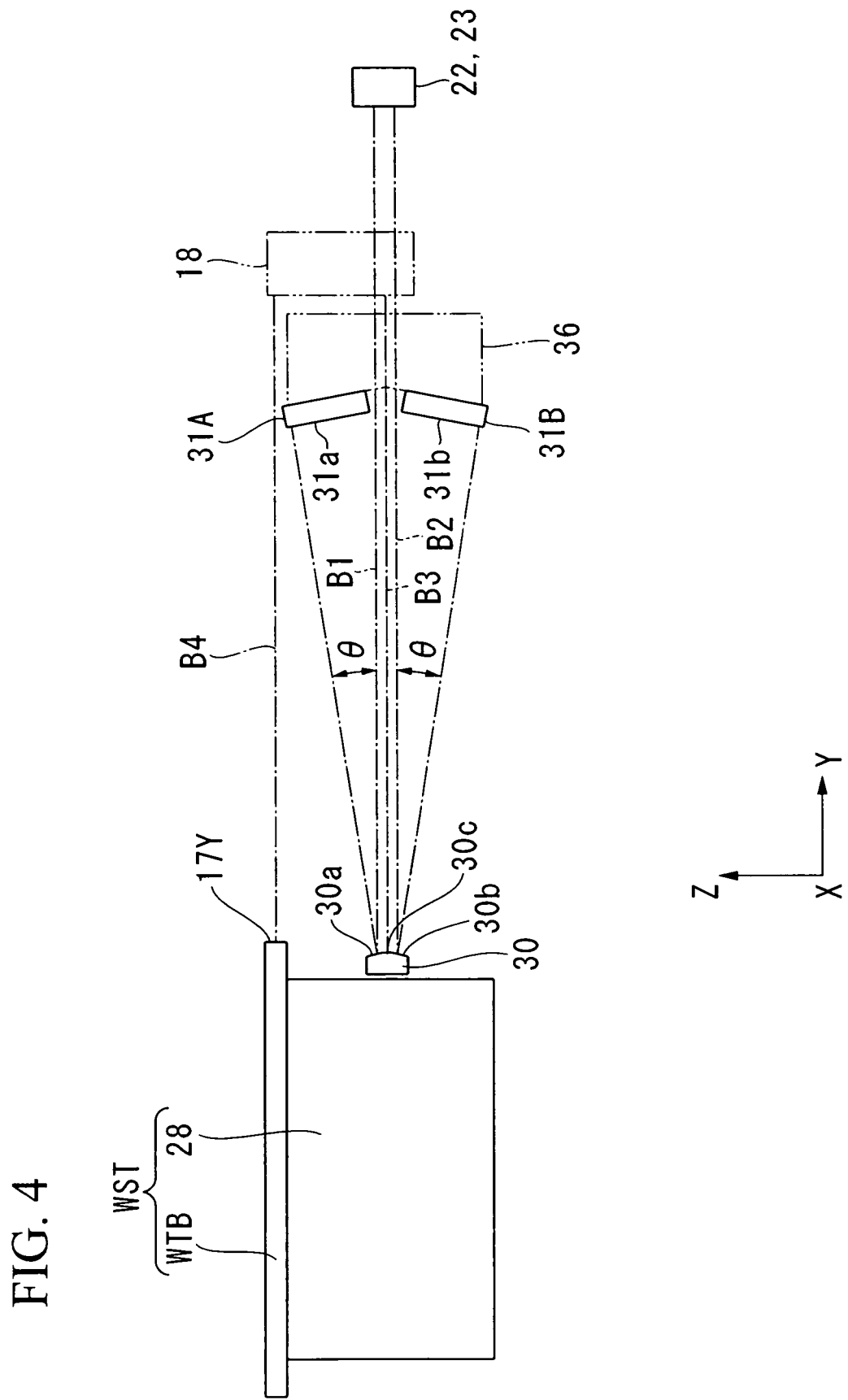
FIG. 4 shows a movable mirror and fixed mirrors provided to a wafer stage.

The interferometer system 118 comprises the Y axis interferometers 16, 18, 19, which were discussed above, the X axis interferometers 21, 46, 47, Z axis interferometers 22, 23, and a movable mirror 30, which is provided to the wafer stage WST; further, as shown in FIG. 1 and FIG. 4, the interferometer system 118 comprises fixed mirrors 31A, 31B (not shown in FIG. 2), which are provided and disposed at a position opposing the movable mirror 30, a movable mirror 60, which is provided to the measurement stage MST, and fixed mirrors 61A, 61B (not shown in FIG. 2), which are provided and disposed at a position opposing the movable mirror 60. Furthermore, the interferometer 16, which was discussed above, also functions as a Z axis interferometer with respect to the measurement stage MST. In addition, the position of at least one of the X position and the Z position is determined so that the Y axis interferometer 18, the Z axis interferometers 22, 23, and the fixed mirrors 31A, 31B do not interfere with the exchange of the wafer W, which is performed between the wafer loader (not shown) and the wafer table WTB (FIG. 4 shows a case wherein the positions of the Y axis interferometer 18, the Z axis interferometers 22, 23, and the fixed mirrors 31A, 31B are lower than the wafer table WTB in the Z direction).

Figure 5:
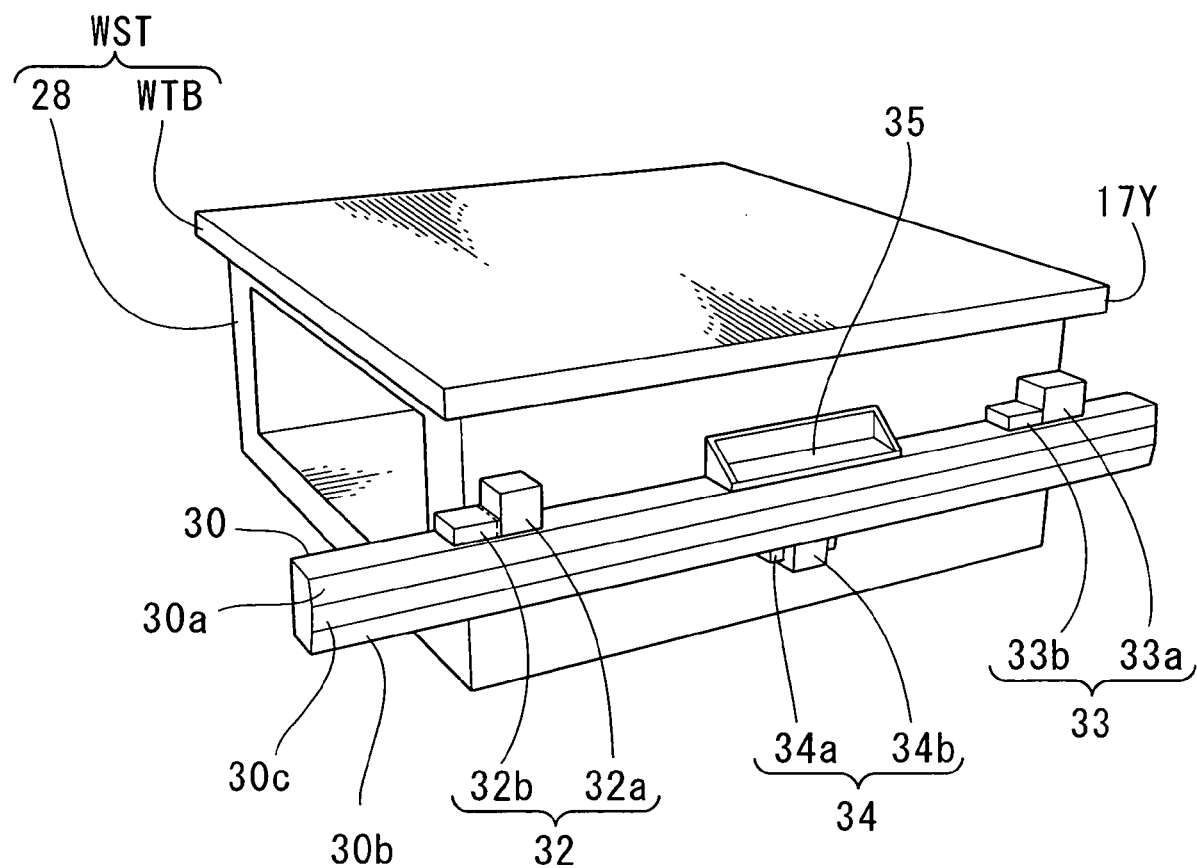
FIG. 5 is an external oblique view of the wafer stage to which the movable mirror is provided.

As shown in FIG. 2 and FIG. 5, the movable mirror 30 is provided to a side part of the wafer stage main body 28 on the +Y side via hinge blocks 32-34, which are capable of absorbing the deformation of the wafer stage main body 28, so that it extends in the X axial direction. The hinge blocks 32, 33 are disposed on both end sides of the movable mirror 30, one on each side, in the longitudinal direction, and comprise fixed bodies 32a, 33a, which are fixed to a side part of the wafer stage main body 28, and fixed bodies 32b, 33b, which are fixed to an upper part of the movable mirror 30. In addition, the hinge block 34 is disposed at substantially the center part of the movable mirror 30 in the longitudinal direction, and comprises a fixed body 34a, which is fixed to a side part of the wafer stage main body 28, and a fixed body 34b, which is fixed to a lower part of the movable mirror 30.

In the hinge blocks 32-34, the rigidity in a prescribed direction of the portion where the fixed bodies 32a-34a and the fixed bodies 32b-34b are linked is set low. For example, a slit is formed by, for example, wire electrical discharge machining between the fixed bodies 32a-34a and the fixed bodies 32b-34b. In the hinge blocks 32-34, the low rigidity portion functions as a hinge or a leaf spring, and absorbs the deformation of the wafer stage main body 28 due to, for example, temperature fluctuations. The hinge blocks 32-34 function as a kinematic mount mechanism, wherein, for example, the hinge block 32 is equivalent to a conical recessed part (cone), the hinge block 33 is equivalent to a flat groove, and the hinge block 34 is equivalent to a V groove, and support the movable mirror 30 on the wafer stage main body 28 in a state wherein the stress, which is caused by, for example, vibrations or temperature changes, is most effectively reduced.

Figure 6:
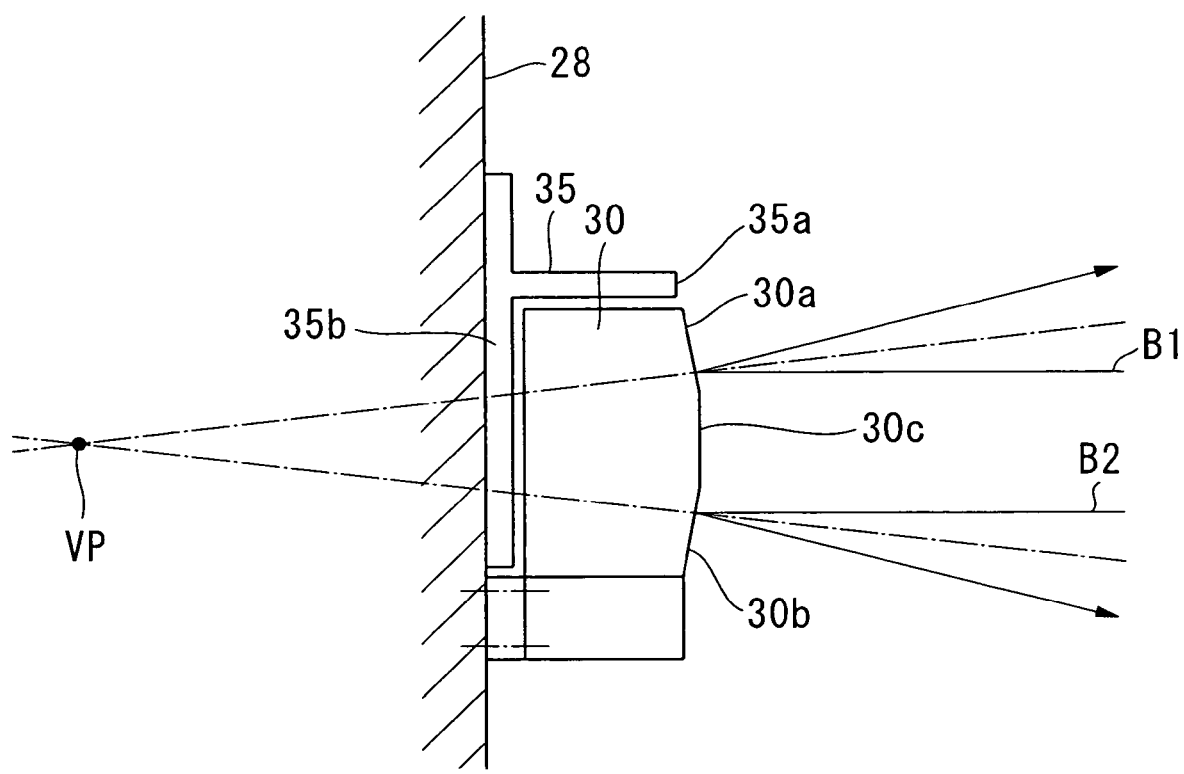
FIG. 6 shows a constitution wherein the movable mirror is supported via a damper member.

In addition, as shown in FIG. 6, a damper member 35 is interposed between the movable mirror 30 and the wafer stage main body 28. The damper member 35 is fixed to the wafer stage main body 28 and comprises: a wall part 35a, which opposes an upper surface (surface on the +Z side) of the movable mirror 30; and a wall part 35b that opposes a rear surface (−Y side surface, wafer stage main body 28 side surface) of the movable mirror 30. The upper and rear surfaces of the movable mirror 30 are disposed between the wall parts 35a, 35b in a state wherein a gap of, for example, approximately 10 μm is formed. The damper member 35 functions as a damper due to the viscosity of the air present in the gap between it and the movable mirror 30.

The movable mirror 30 comprises reflecting surfaces 30a, 30b, 30c, which are each formed longer in the X axial direction than the reflecting surface 17Y of the wafer table WTB. Thereby, the Z axis interferometers 22, 23 can measure the position of the wafer stage WST in the Z direction over the large range of motion of the wafer stage WST in the X direction. The reflecting surface 30a is formed parallel to a surface that is inclined with respect to the XZ plane at a prescribed angle about the X axis, i.e., extends in a direction that includes a Z direction component. The reflecting surface 30b is formed substantially symmetric to the reflecting surface 30a with respect to the surface that is parallel to the XY plane, and extends in a direction that includes a Z direction component. The reflecting surface 30c is provided parallel to the XZ plane so that it is between the reflecting surface 30a and the reflecting surface 30b and extends in the X axial direction.

As shown in FIG. 2 and FIG. 3, the Z axis interferometers 22, 23 are disposed spaced apart in the X axial direction. As shown in FIG. 4, the Z axis interferometers 22, 23 project an interferometer beam B1 and an interferometer beam B2 along the Y axial direction toward the reflecting surface 30a and the reflecting surface 30b, respectively, and detect the position of the wafer stage WST in the Z axial direction and/or the Y axial direction by receiving the interferometer beams B1, B2 that were reflected by the reflecting surfaces 30a, 30b. Furthermore, the calculation of the position of the wafer stage WST is discussed later.

The fixed mirror 31A comprises a reflecting surface 31a that is inclined with respect to the XZ plane so that it is optically connected to the reflecting surface 30a of the movable mirror 30, is orthogonal to the interferometer beam B1 reflected by the reflecting surface 30a, and retroreflects the interferometer beam B1 toward the reflecting surface 30a. Likewise, the fixed mirror 31B comprises a reflecting surface 31b that is inclined with respect to the XZ plane so that it is optically connected to the reflecting surface 30b of the movable mirror 30, is orthogonal to the interferometer beam B2 reflected by the reflecting surface 30b, and retroreflects the interferometer beam B2 toward the reflecting surface 30b. These fixed mirrors 31A, 31B are supported by a support body 36 (refer to FIG. 4) that is identical to, for example, that provided to a plate (not shown) that supports the projection unit PU. A hole, a notch, and the like, wherethrough the interferometer beams B1, B2 and an interferometer beam B3 pass, is provided to the support body 36.

In addition, it is preferable that the support body 36 is made of a low thermal expansion material (e.g., Zerodur® or invar). In addition, each of the interferometers 22, 23 has interferometer optical members, such as a polarizing beam splitter, a bending mirror, a wave plate, and a relay optical system. The interferometers 22, 23, which each include these interferometer optical members, are disposed so that they are spaced apart from the wafer stage WST further than from the fixed mirrors 31A, 31B, as shown in FIG. 4. This is because, if the interferometers 22, 23, which each include the interferometer optical members, are closer to the wafer stage WST than the fixed mirrors 31A, 31B, then it is necessary to increase the spacing (opening angle) between the fixed mirrors 31A, 31B, and there is consequently a problem in that it becomes difficult to avoid obstacles (for example, the ceiling and the base plate). In addition, it is conceivable to dispose the interferometers 22, 23, including the fixed mirrors 31A, 31B, so that it is greatly spaced apart from the stage WST, with the interferometers 22, 23, including the interferometer optical members, disposed as is nearer to the wafer stage WST than the fixed mirrors 31A, 31B, but there is a problem in that the width of the apparatus will increase along with the optical path length (thereby increasing fluctuations).

Consequently, as shown in FIG. 4, it is possible to reduce the space occupied by the beams without increasing the size of the apparatus by appropriately setting the spacing (opening angle) between the fixed mirrors 31A, 31B by disposing the interferometers 22, 23, which each include the interferometer optical members, separated from the wafer stage WST further than from the fixed mirrors 31A, 31B.

The Y axis interferometer 18 has a length measuring axis that is parallel to the Y axis and links the center of projection (optical axis AX; refer to FIG. 1) of a projection optical system PL with the center of detection of the alignment system ALG, and detects the position of the wafer table WTB in the Y axial direction by irradiating an interferometer beam B4 to the reflecting surface 17Y of the wafer table WTB and then receiving that reflected beam, as shown in FIG. 4. In addition, the Y axis interferometer 18 has a prescribed spacing between it and the interferometer beam B4 in the Z axial direction, and detects the position of the movable mirror 30 (i.e., the wafer stage WST) in the Y axial direction by projecting the interferometer beam B3 along the Y axial direction toward the reflecting surface 30c, and receiving the interferometer beam B3 reflected by the reflecting surface 30c. In addition, the Y axis interferometer 18 detects the displacement (amount of pitching) of the wafer stage WST in the direction about the X axis (the θX direction) based on the position of the reflecting surface 17Y and the reflecting surface 30c in the Y axial direction.

The Y axis interferometer 19 detects the position of the wafer table WTB in the Y axial direction at a wafer exchange position (loading position) LP.

The X axis interferometer 46 is an interferometer that selects and measures the X position of a measurement table MTB and the X position of the wafer table WTB, and has a length measuring axis (length measuring axis at the projection center position in the Y axial direction) that is parallel to the X axis where the length measuring axis of the Y axis interferometer 18 and the center of projection of the projection optical system PL perpendicularly intersect. In addition, the X axis interferometer 46 has a length measuring axis (length measuring axis at the alignment center position in the Y axial direction) that is parallel to the X axis and passes through the detection center of the alignment system ALG.

In addition, when performing the exposure operation, the X axis interferometer 46 measures the position of the wafer table WTB in the X direction on the length measuring axis at the projection center position; furthermore, when performing enhanced global alignment (EGA), the X axis interferometer 46 measures the position of the wafer table WTB in the X direction on the length measuring axis at the alignment center position. In addition, the X axis interferometer 46 measures the position of the measurement table MTB in the X direction by appropriately using two length measuring axes in accordance with what is to be measured, such as the baseline measurement. In other words, the X axis interferometer 46 is capable of measuring the position of the wafer table WTB or the measurement table MTB in the X axial direction at the projection center position and the alignment center position in the Y axial direction.

The X axis interferometer 47 detects the position of the wafer table WTB in the X axial direction at the wafer exchange position (loading position) LP. In addition, the X axis interferometer 47 is constituted so that it is also capable of measuring the displacement of the wafer stage WST in the θY direction (amount of rolling) by projecting two interferometer beams, which are spaced apart in the Z axial direction, to the reflecting surface 17X, and then receiving the reflected light of each of the interferometer beams.

Returning to FIG. 2, the measurement stage MST, like the wafer stage WST, comprises a measurement stage main body 52, which is disposed on the base plate 12, and a measurement table MTB, which is mounted via a Z tilt drive mechanism (not shown) on the measurement stage main body 52. The Z tilt drive mechanism comprises three actuators (e.g., voice coil motors and El cores) that support the measurement table MTB on the measurement stage main body 52 at three points, and finely drives the measurement table MTB in the directions of the three degrees of freedom, i.e., the Z axial direction, the θx direction, and the θy direction, by adjusting the drive of each of the actuators.

The measurement stage main body 52 comprises a hollow member, which is rectangularly frame shaped in its cross section and extends in the X axial direction. A plurality of (e.g., four) aerostatic bearings (not shown), e.g., air bearings, is provided to the lower surface of the measurement stage main body 52. The measurement stage MST is noncontactually and levitationally supported above the guide surface 12a via these air bearings with a clearance of approximately several microns.

A magnet unit 54, which comprises permanent magnet groups that serve as a slider in the X axial direction, is provided inside the measurement stage main body 52. An X axis stator 81, which extends in the X axial direction, is inserted in an internal space of the magnet unit 54. This X axis stator 81 comprises an armature unit, wherein a plurality of armature coils are built in and disposed at prescribed intervals along the X axial direction. In this case, the magnet unit 54 and the X axis stator 81, which comprises the armature unit, constitute a moving magnet type X axis linear motor that drives the measurement stage MST in the X axial direction. The above-mentioned X axis linear motor shall henceforth generically be called the X axis linear motor 81 and will use the same symbol as the stator (X axis stator) 81.

Sliders 84, 85, which each comprise an armature unit wherein, for example, a plurality of armature coils are built in and disposed at prescribed intervals along the Y axial direction, are fixed to the end parts on both sides of the X axis stator 81 in the longitudinal direction, one on each side. Each of these sliders 84, 85 is inserted in each of the Y axis stators 86, 87, which were discussed above, respectively, from the inner side. Namely, in the present embodiment, the sliders 84, 85, which each comprise an electric unit, and the Y axis stators 86, 87, which each comprise a magnet unit, constitute a moving coil type Y axis linear motor. Hereinbelow, the above-mentioned two Y axis linear motors are generically referred to as the Y axis linear motors 84, 85, and use the same symbols as the sliders 84, 85.

The measurement stage MST is driven in the X axial direction by the X axis linear motor 81, and in the Y axial direction integrally therewith by the pair of Y axis linear motors 84, 85. In addition, the measurement stage MST is rotationally driven in the θz direction by slightly varying the driving force generated by each of the Y axis linear motors 84, 85 in the Y axial direction. Accordingly, the measurement table MTB can be finely driven without contact in each direction (X, Y, Z, θx, θy, θz) of the six degrees of freedom by driving the three actuators, which support the measurement table MTB, the X axis linear motor 81, and the Y axis linear motors 84, 85. The measurement table MTB may be directly driven in the directions of the six degrees of freedom by increasing the number of actuators connected thereto.

Figure 8:
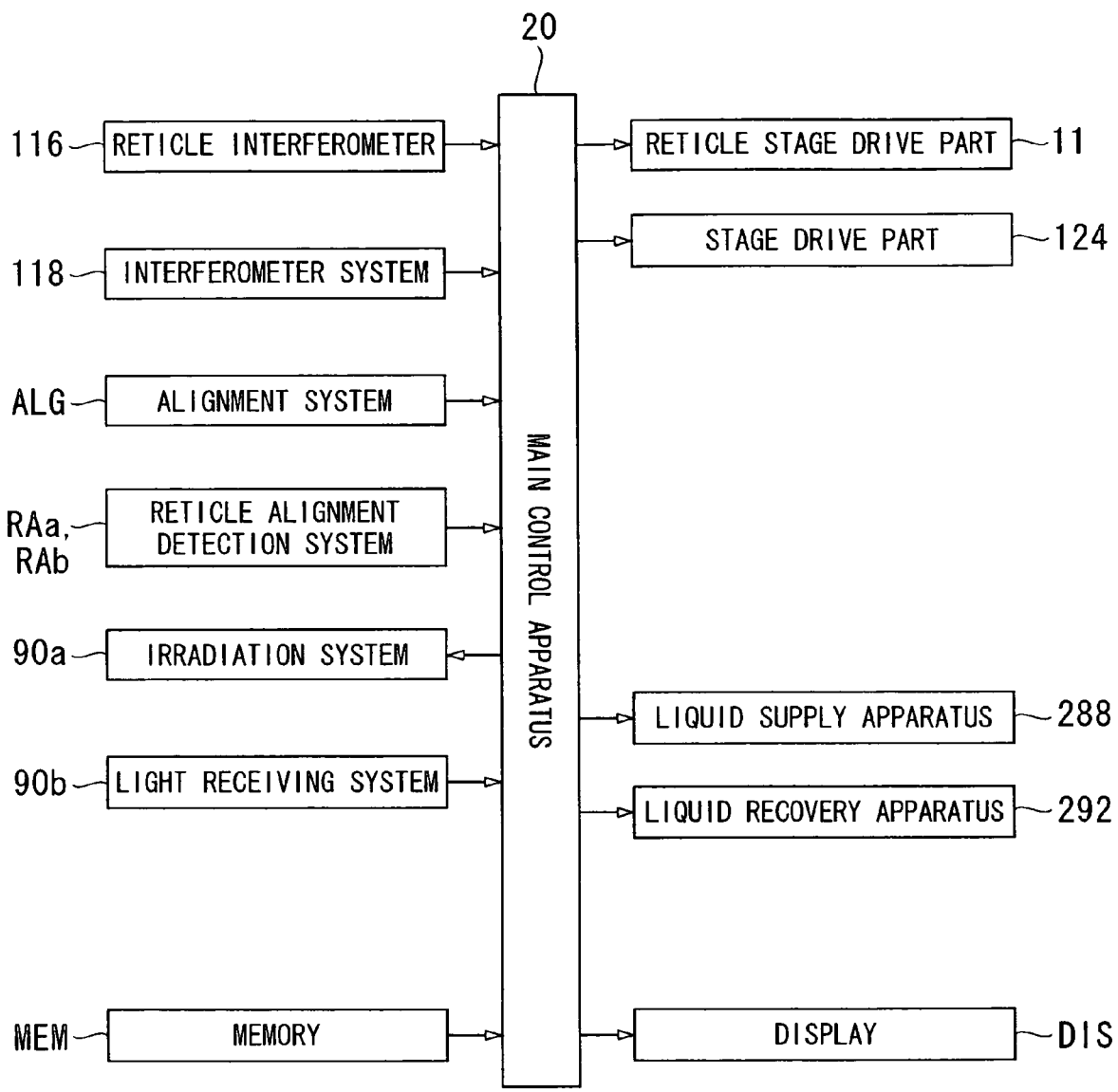
FIG. 8 is a block diagram that shows the principal components of a control system of the exposure apparatus.

As is apparent from the explanation so far, the stage drive part 124, which is shown in FIG. 8, in the present embodiment comprises a fine movement mechanism (not shown) that drives the Y axis linear motors 82-85, the X axis linear motors 80, 81, and the wafer table WTB, as well as a drive mechanism (not shown) that drives the measurement table MTB. A main control apparatus 20 shown in FIG. 8 controls the various drive mechanisms that constitute the stage drive part 124.

The measurement table MTB further comprises measuring instruments for performing various measurements related to the exposure. In detail, a plate 101, which is made of a glass material such as quartz glass, is provided to the upper surface of the measurement table MTB. The entire surface of the plate 101 is coated with chromium; furthermore, an area for the measuring instruments and/or a fiducial mark area FM, wherein a plurality of fiducial marks are formed as disclosed in, for example, Japanese Published Unexamined Patent Application No. H5-21314 (corresponding U.S. Pat. No. 5,243,195), is provided at a prescribed position.

A reflecting surface 117Y that is orthogonal to the Y axial direction (i.e., extends in the X axial direction) is formed by mirror surface processing at one end (−Y side end) of the measurement table MTB (plate 101) in the Y axial direction. In addition, a reflecting surface 117X that is orthogonal to the X axial direction (i.e., extends in the Y axial direction) is formed by mirror surface processing at one end (+X side end) of the measurement table MTB in the X axial direction.

In addition, the movable mirror 60, which was discussed above, is provided to a side part of the measurement stage MST (measurement stage main body 52) on the −Y side. Because the movable mirror 60 is supported by the measurement stage MST via hinge blocks and a damper member is interposed between the movable mirror 60 and the measurement stage MST, the same as the movable mirror 30, the explanation of the movable mirror 60 is omitted.

Figure 7:
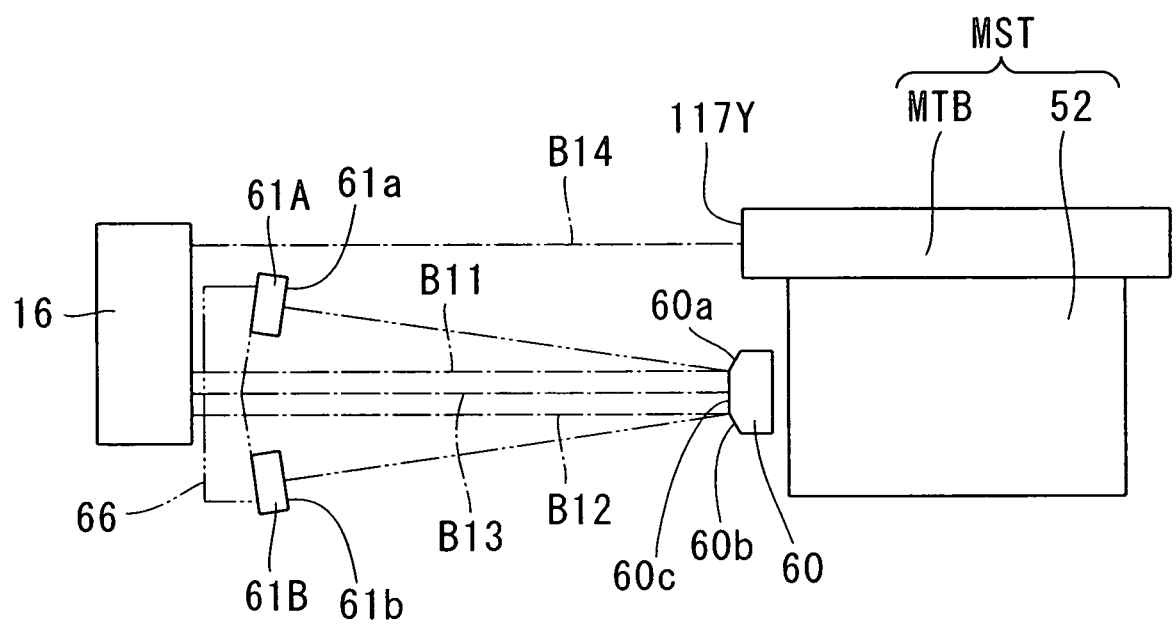
FIG. 7 shows a movable mirror and fixed mirrors provided to a measurement stage.

As shown in FIG. 7, the movable mirror 60 comprises reflecting surfaces 60*a*, 60*b*, 60*c*. The reflecting surface 60*a* extends in a direction wherein its normal line includes a Z direction component, and is formed parallel to a surface that is inclined about the X axis with respect to the XZ plane. The reflecting surface 60*b* extends in a direction wherein its normal line includes a Z direction component, and is formed substantially symmetric to the reflecting surface 60*a* with respect to a surface that is parallel to the XY plane. The reflecting surface 60*c* is provided between the reflecting surface 60*a* and the reflecting surface 60*b* so that its normal line extends in the Y axial direction.

The interferometer 16 projects an interferometer beam B11 along the Y axial direction toward the reflecting surface 60*a* and an interferometer beam B12 along the Y axial direction toward the reflecting surface 60*b*, detects the position of the measurement stage MST in the Y axial direction, and, as a Z axis interferometer, detects the position of the measurement stage MST in the Z axial direction by receiving the interferometer beams B11, B12 reflected by the reflecting surfaces 60*a*, 60*b*. The interferometer 16 projects and receives these interferometer beams B11, B12 at two locations, respectively, spaced apart in the X axial direction.

In addition, the interferometer 16 projects an interferometer beam B14 to the reflecting surface 117Y and detects the position of the measurement table MTB in the Y axial direction by receiving the reflected light thereof. Furthermore, the interferometer 16 projects an interferometer beam B13 along the Y axial direction toward the reflecting surface 60*c* with a prescribed spacing in the Z axial direction with respect to the interferometer beam B14, and detects the position of the reflecting mirror 60 (i.e., the measurement stage MST) in the Y axial direction by receiving the interferometer beam B13 reflected by the reflecting surface 60*c*. In addition, the Y axis interferometer 16 detects the displacement (amount of pitching) of the measurement stage MST in a direction (θX direction) about the X axis based on the position of the reflecting surface 117Y and the reflecting surface 60*c* in the Y axial direction.

The fixed mirror 61A comprises a reflecting surface 61*a* that is inclined with respect to the XZ plane so that it is optically connected to the reflecting surface 60*a* of the movable mirror 60, is orthogonal to the interferometer beam B11 reflected by the reflecting surface 60*a*, and retroreflects the interferometer beam B11 toward the reflecting surface 60*a*. Likewise, the fixed mirror 61B comprises a reflecting surface 61*b* that is inclined with respect to the XZ plane so that it is optically connected to the reflecting surface 60*b* of the movable mirror 60, is orthogonal to the interferometer beam B12 reflected by the reflecting surface 60*b*, and retroreflects the interferometer beam B12 toward the reflecting surface 60*b*. These fixed mirrors 61A, 61B are both supported by a support body 66 (refer to FIG. 7), which is provided to, for example, the frame (not shown) that supports the projection unit PU.

Returning to FIG. 1, the illumination system 10 irradiates a slit shaped illumination area on the reticle R, which is defined by a reticle blind (not shown), with an illumination light (exposure light) IL, which serves as an energy beam, that has a substantially uniform luminous flux intensity. Here, as one example, ArF excimer laser light (193 nm wavelength) is used as the illumination light IL.

The reticle R, which has a surface (the lower surface in FIG. 1) wherein a pattern, such as a circuit pattern, is formed, is fixed to the reticle stage RST by, for example, vacuum chucking. The reticle stage RST is capable of fine movement within the XY plane, which is perpendicular to the optical axis of the illumination system 10 (aligned with the optical axis AX of the projection optical system PL, which is discussed later), by a reticle stage drive part 11 (not shown in FIG. 1, but refer to FIG. 8), which includes, for example, a linear motor, and is capable of moving at a specified scanning speed in a prescribed scanning direction (here, the Y axial direction, which is the lateral direction, within the paper surface in FIG. 1).

The position (including the rotational position about the Z axis) of the reticle stage RST within the plane of motion of the stage is continuously detected by a reticle laser interferometer (hereinafter, generically referred to as a reticle interferometer) 116, which has a resolving power of, for example, approximately 0.5-1 nm, via a movable mirror 15 (actually, a Y movable mirror that has a reflecting surface orthogonal to the Y axial direction and an X movable mirror that has a reflecting surface orthogonal to the X axial direction are provided). A measurement value of the reticle interferometer 116 is sent to the main control apparatus 20 (not shown in FIG. 1, but refer to FIG. 8). The main control apparatus 20 calculates the position of the reticle stage RST in the X axial direction, the Y axial direction, and the θZ direction (the rotational direction about the Z axis) based on the measurement values of the reticle interferometer 116, and controls the position (and the velocity) of the reticle stage RST by controlling the reticle stage drive part 11 based on the calculation results.

A pair of reticle alignment detection systems RAa, RAb is provided above the reticle R spaced apart in the X axial direction by a prescribed distance, and comprise a TTR (Through the Reticle) system that uses light of the same wavelength as the exposure light in order to simultaneously observe a pair of reticle alignment marks, which are on the reticle R, as well as a pair of fiducial marks, which are on the measurement stage MST and correspond to the pair of reticle alignment marks, through the projection optical system PL. A system constituted the same as the one disclosed in, for example, Japanese Published Unexamined Patent Application No. H7-176468 (corresponding U.S. Pat. No. 5,646,413) may be used as the reticle alignment detection systems RAa, RAb.

The projection unit PU includes the projection optical system PL, which comprises a lens barrel 40 and a plurality of optical elements that are held therein with a prescribed positional relationship. A dioptric system comprising a plurality of lenses (lens elements) that each have a common optical axis AX in, for example, the Z axial direction, is used as the projection optical system PL.

In addition, the exposure apparatus 100 of the present embodiment performs exposure that is adapted to a liquid immersion method that exposes the wafer W through a liquid, and consequently, a liquid supply nozzle 51A and a liquid recovery nozzle 51B, which constitute an immersion apparatus 132, are provided in the vicinity of a lens (hereinafter, also referred to as a front lens) 91, which is the optical element that is most on the image plane side (wafer W side) of the optical elements that constitute the projection optical system PL. One end of the liquid supply nozzle 51A is connected to the other end of a supply pipe (not shown), which is connected to a liquid supply apparatus 288 (not shown in FIG. 1, but refer to FIG. 8). One end of the liquid recovery nozzle 51B is connected to the other end of a recovery pipe (not shown), which is connected to a liquid recovery apparatus 292 (not shown in FIG. 1, but refer to FIG. 8).

Here, ultrapure water (hereinafter, simply noted as "water" except in cases where it is particularly necessary), which transmits ArF excimer laser light (light of a 193 nm wavelength), is used as the abovementioned liquid. By recovering water via the liquid recovery nozzle 51B while supplying water from the liquid supply nozzle 51A to the wafer W, it is possible to form a partial (local) immersion area Lq on the wafer W. Furthermore, when performing a measurement operation using the measurement stage MST, it is possible to move the immersion area Lq from the wafer stage WST to the measurement stage MST by moving them in the Y direction. The measurement stage MST can perform various measurements through the immersion area Lq. Consequently, the water in the immersion area Lq is not fully recovered when exchanging the wafer W, and therefore throughput does not decline and, further, a watermark is not formed.

In addition, with the exposure apparatus 100 of the present embodiment, the off axis alignment system ALG (hereinafter, generically referred to as the alignment system) is provided to the holding member that holds the projection unit PU. For this alignment system ALG, a sensor of an image processing type FIA (Field Image Alignment) system is used that: irradiates a target mark with a broadband detection light beam, which does not photosensitize the resist on, for example, the wafer W; uses an imaging device (for example, CCD) to capture an image of an index (an index pattern on an index plate provided in the alignment system ALG), which is not shown, and an image of a target mark that is imaged on a light receiving surface by the light reflected from that target mark; and outputs imaging signals thereof. The imaging signals from the alignment system ALG are supplied to the main control apparatus 20 shown in FIG. 8.

In addition, although not shown in FIG. 1, the exposure apparatus 100 of the present embodiment is provided with an oblique incidence type multi-focal point position detection system, which comprises an irradiation system 90a and a light receiving system 90b (refer to FIG. 8).

FIG. 8 shows the principal components of the control system of the exposure apparatus 100. This control system principally comprises the main control apparatus 20, which comprises a microcomputer (or a workstation) that performs supervisory control of the entire apparatus. In addition, memory MEM and a display DIS, such as a CRT display (or a liquid crystal display), are connected to the main control apparatus 20.

The following explains the operation of the interferometer system 118 within the exposure apparatus 100 constituted as described above, referencing FIG. 2-FIG. 4 and FIG. 7. In the present embodiment, the interferometer beam B4 from the Y axis interferometer 18 continuously irradiates the reflecting surface 17Y over the entire area of the range of motion of the wafer stage WST, and the interferometer beam B14 from the Y axis interferometer 16 continuously irradiates the reflecting surface 117Y over the entire area of the range of motion of the measurement stage MST. Accordingly, the positions of the stages WST, MST in the Y axial direction are continuously managed by the main control apparatus 20 based on the measurement values of the Y axis interferometers 16, 18.

On the other hand, the main control apparatus 20 manages the X position of the wafer table WTB (the wafer stage WST), based on the output values of the X axis interferometer 46, just in the range wherein the interferometer beam from the X axis interferometer 46 irradiates the reflecting surface 17X, and manages the X position of the measurement table MTB (the measurement stage MST) based on the output values of the X axis interferometer 46 just in the range wherein the interferometer beam from the X axis interferometer 46 irradiates the reflecting surface 117X. Accordingly, when the X position of the wafer table WTB cannot be managed based on the output values of the X axis interferometer 46, e.g., in the vicinity of the wafer exchange position (loading position) LP, it is managed based on the output values of the X axis interferometer 47. However, when the X position of the measurement table MTB cannot be managed based on the output values of the X axis interferometer 46, it is managed based on the output values of the X axis interferometer 21.

Continuing, positional measurement of the wafer stage WST, including measurement of the Z position by the Z axis interferometers 22, 23 and the Y axis interferometer 18, will now be explained. Furthermore, positional measurement of the measurement stage MST, including measurement of the Z position by the interferometer 16, is the same as for the wafer stage WST, and consequently only the wafer stage WST is explained here.

At certain times, such as when the wafer stage WST moves, the interferometer beams B1, B2 from the Z axis interferometers 22, 23 are projected to the movable mirror 30, and are then reflected by the reflecting surfaces 30a, 30b at an angle θ with respect to the incident beams. The Z axis interferometers 22, 23 receive the interferometer beams B1, B2, which are reflected by the reflecting surfaces 31a, and 31b of the fixed mirrors 31A, 31B and the reflecting surfaces 30a, 30b of the movable mirror 30.

Here, if we let the displacement of the wafer stage WST (i.e., the movable mirror 30) in the Y axial direction be ΔYo, and the displacement in the Z axial direction be ΔZo, then the change in an optical path length ΔL1 of the interferometer beam B1 and the change in an optical path length ΔL2 of the interferometer beam B2, which are received by the Z axis interferometers 22, 23, are expressed by the following equations:

$$\Delta L1 \approx \Delta Yo \times \cos\theta - \Delta Zo \times \sin\theta \quad (1)$$

$$\Delta L2 \approx \Delta Yo \times \cos\theta + \Delta Zo \times \sin\theta \quad (2)$$

Accordingly, ΔZo and ΔYo are derived by the following equations based on equations (1), (2):

$$\Delta Zo = (\Delta L2 - \Delta L1)/2\sin\theta \quad (3)$$

$$\Delta Yo = (\Delta L1 + \Delta L2)/2\cos\theta \quad (4)$$

At this time, the derived displacements ΔZo, ΔYo are the displacements of the wafer stage WST at a measurement point VP, which is the point of intersection of the normal lines of the reflecting surfaces 30a, 30 where the interferometer beams B1, B2 intersect those surfaces.

Because the abovementioned displacements ΔZo, ΔYo are derived by the Z axis interferometers 22, 23, respectively, if we let the displacements derived by the Z axis interferometer 22 be ΔZoL, ΔYoL, the displacements derived by the Z axis interferometer 23 be ΔZoR, ΔYoR, and the distance by which the interferometer beams B1, B2 projected by the Z axis interferometers 22, 23 are spaced apart in the X axial direction be D (refer to FIG. 3), then the displacement (amount of yawing) ΔθZ of the movable mirror 30 (i.e., the wafer stage WST) in the θZ direction and the displacement (amount of rolling) ΔθY of the movable mirror 30 (i.e., the wafer stage WST) in the θY direction are derived by the following equations:

$$\Delta\theta Z = (\Delta YoR - \Delta YoL)/D \quad (5)$$

$$\Delta\theta Y = (\Delta ZoL - \Delta ZoR)/D \quad (6)$$

In so doing, the displacement of the wafer stage WST is derived for four degrees of freedom, i.e., ΔZo, ΔYo, ΔθZ, ΔθY, based on the measurement results of the Z axis interferometers 22, 23.

In addition, as discussed above, the displacement (amount of pitching) ΔθX of the wafer stage WST in the θX direction is derived, based on the measurement results of the Y axis interferometer 18 using the interferometer beams B3, B4, from the displacement of the reflecting surface 17Y of the wafer table WTB in the Y axial direction and the displacement of the reflecting surface 30c of the movable mirror 30 in the Y axial direction. In addition, a displacement AX of the wafer stage WST in the X axial direction is derived based on the measurement results of the X axis interferometer 46. Accordingly, the displacement of the wafer stage WST is derived for six degrees of freedom, i.e., the Z, X, Y, θZ, θX, and θY directions, based on the measurement results of the interferometer system 118.

However, if the wafer stage WST (wafer stage main body 28) expands and is deformed by the heat generated by, for example, driving the X axis linear motor 80, then the hinge blocks 32-34, which are interposed between the wafer stage main body 28 and the movable mirror 30, will absorb the deformation of the wafer stage main body 28, which makes it possible to reduce the stress transmitted to the movable mirror 30 and to prevent the degradation of the measurement results of the displacement of the wafer stage WST caused thereby.

Here, if the movable mirror 30 is originally curved due to, for example, fabrication error, then that curve is corrected based on the measurement results of the Z axis interferometers 22, 23. Specifically, the wafer stage WST first moves to a position (e.g., the loading position LP) where the X axis interferometer 47 is capable of positional measurement. The amount of rolling of the wafer stage WST is measured based on the measurement result of the X axis interferometer 47, and the wafer stage WST is driven in the X axial direction while holding the amount of rolling to a fixed value. In addition, when moving the wafer stage WST in the X axial direction, the amount of rolling of the wafer stage WST is measured using the Z axis interferometers 22, 23.

At this time, although the amount of rolling of the wafer stage WST is held to a fixed value, if the amount of rolling measured by the Z axis interferometers 22, 23 differs from that fixed value, then it is assumed that the difference in the amount of rolling is caused by the curvature of the movable mirror 30, the amount of rolling is associated with the measured position in the X axial direction, and the amount of curvature of the movable mirror 30, which corresponds to the difference in the amount of rolling, is stored as a correction value. During, for example, the exposure process, it is possible to eliminate errors in the measurement results of the Z axis interferometers 22, 23 that are caused by the curvature of the movable mirror 30 by using the stored correction value to correct the Z position and the amount of rolling. Likewise, in the measurement stage MST, the Z displacement, the amount of rolling, and the amount of pitching are derived based on the measurement results of the interferometer 16.

The main control apparatus 20 positions the front surface of the wafer W at the focal point position of the projection optical system PL by driving the three actuators that support the wafer table WTB based on: the Z displacement and the amount of rolling derived using the measurement results of the Z axis interferometers 22, 23 and the abovementioned correction value; and the amount of pitching that was derived using the measurement results of the Y axis interferometer 18; in addition, the main control apparatus 20 performs a leveling adjustment so as to make the front surface of the wafer W orthogonal to the optical axis AX of the illumination light IL. Thereby, the wafer W is positioned at a prescribed Z position and a prescribed attitude.

Likewise, for the measurement stage MST, the main control apparatus 20 positions the front surface of the fiducial mark area FM at the focal point position of the projection optical system PL by driving the three actuators that support the measurement table MTB based on the derived Z displacement, amount of rolling, and amount of pitching, and performs leveling adjustment so that the front surface of the fiducial mark area FM is orthogonal to the optical axis AX of the illumination light IL. Thereby, the fiducial mark area FM is positioned at a prescribed Z position and a prescribed attitude.

When the wafer W is positioned via the wafer stage WST, the main control apparatus 20 forms the partial (local) immersion area Lq by controlling the opening and closing of the valves of the liquid supply apparatus 288 and the liquid recovery apparatus 292 of the immersion apparatus 132 so as to continuously fill water directly below the front lens 91 of the projection optical system PL. Based on the result of wafer alignment, e.g., enhanced global alignment (EGA), which is performed in advance, and on the latest baseline measurement result of the alignment system ALG, the main control apparatus 20 performs the exposure process by repetitively performing an inter-shot movement operation, wherein the wafer stage WST is moved to a scanning start position (acceleration start position) in order to expose each shot region on the wafer W, and a scanning exposure operation that transfers a pattern, which is formed in the reticle R, to each shot region by a scanning exposure system.

Furthermore, as recited in Japanese Patent Application No. 2005-120187 (corresponding PCT International Publication WO 2006/013856) previously filed by the present applicant, the immersion area Lq formed on the wafer stage WST is moved to the measurement stage MST, where various measurements operations through the immersion area Lq are performed. Consequently, after the scanning exposure operation ends, the movement of the measurement stage MST in the +Y direction brings it proximate to the wafer stage WST. The movement of the wafer stage WST and the measurement stage MST in the +Y direction while maintaining this proximate state enables the immersion area Lq to be moved from the wafer stage WST to the measurement stage MST.

In the present embodiment, the movable mirror 30 is provided on the +Y side of the wafer stage WST, and the movable mirror 60 is provided on the −Y side of the measurement stage 52. Consequently, even if the wafer stage WST and the measurement stage MST approach one another as discussed above, the movable mirror 30 and the movable mirror 60 do not interfere therewith. In addition, even when transferring the immersion area Lq from the wafer stage WST to the measurement stage MST, water does not contact the movable mirror 30 and the movable mirror 60.

As explained above, in the present embodiment, it is possible to detect the Z displacement of each of the stages WST, MST without providing a reflecting plate above the wafer stage WST and/or the measurement stage MST by projecting the interferometer beams B1, B2 and B11, 12 along the Y axial direction to the reflecting surfaces 30a, 30b and 60a, 60b of the movable mirrors 30, 60, which are mounted to each of the stages WST, MST, respectively, and it is therefore possible to dispose the various measuring instruments used to measure the positions of the projection optical system PL and the wafer W without hindrance, and to avoid an increase in the size of the apparatus.

In addition, in the present embodiment, the interferometer beams B1, B2, B11, B12, which are used to detect positions in the Z axial direction, do not move, and it is therefore possible to reduce the size of the fixed mirrors 31A, 31B, 61A, 61B, as well as to increase the number of degrees of freedom in the design and to further reduce the size of the apparatus because the optical path space of the interferometer beams, which is limited when disposing other equipment, also decreases. Furthermore, the reduction in the optical path space of the interferometer beams also reduces the area that must be air conditioned as well as the size of the air conditioning equipment.

In addition, in the present embodiment, the positions in the Z axial direction are measured via the substantially symmetrically disposed reflecting surfaces 30a, 30b and 60a, 60b, which offsets various errors and significantly offsets air fluctuations that affect those reflecting surfaces, and it is therefore possible to measure the positions in the Z axial direction (as well as the Y axial direction, the amount of rolling, and the amount of yawing) with high precision. In addition, as discussed above, the fixed mirrors 31A, 31B, 61A, 61B are also reduced in size, which also makes it possible to increase the angle θ at which the interferometer beams are reflected, thereby contributing to higher precision positional measurement.

Moreover, with the present embodiment, the abovementioned fixed mirrors ((31A, 31B) and (61A, 61B)) are supported by the support bodies 36, 66, respectively, which tends to eliminate errors in their relative positional relationships and makes it possible to reduce errors in measurement results. Furthermore, with the present embodiment, even if there is a curvature in the reflecting surfaces 30a, 30b, 60a, 60b of the movable mirrors 30, 60, it is possible to easily correct errors caused thereby, which can substantially contribute to improving measurement accuracy.

In addition, with the present embodiment, the movable mirrors 30, 60 comprise the reflecting surfaces 30c, 60c, which makes it possible to calculate the amount of pitching of each of the stages WST, MST using the measurement values measured via the reflecting surfaces 17Y, 117Y, which are greatly spaced apart in the Z axial direction, as well as to enable high precision measurement of the pitching amount.

Moreover, with the present embodiment, the movable mirrors 30, 60 are supported by hinge blocks, which function as a kinematic mount mechanism, and it is therefore possible to prevent the adverse impact of, for example, thermal deformation and deformation caused by the stages WST, MST, as well as to suppress the transmission of vibrations of the stages WST, MST to the movable mirrors 30, 60. Accordingly, with the present embodiment, it is possible to eliminate disturbance factors that act upon the movable mirrors 30, 60, and to easily maintain measurement accuracy.

In addition, with the present embodiment, the movable mirror 30 is formed in the X axial direction longer than the reflecting surface 17Y in the X axial direction, which makes it possible to measure the position of the wafer stage WST in the Z axial direction even if the wafer stage WST is outside of the range wherein its position can be measured by the Y axis interferometer 18.

The movable mirrors 30, 36 explained in the abovementioned embodiment comprise reflecting surfaces 30c, 60c, respectively, that are parallel to the XZ plane, but the present invention is not limited thereto and may be constituted so that the movable mirrors 30, 36 are formed V shaped in a cross section that has the reflecting surfaces 30a, 30b and 60a, 60b.

In this case, the amount of pitching may be calculated using the positions of the stages MST, WST in the Y axial direction that were derived as a result of the interferometer beams being reflected by the reflecting surfaces 17Y, 117Y, and the positions in the Y axial direction that were derived as a result of the interferometer beams being reflected by the reflecting surfaces 30a, 30b and 60a, 60b.

Figure 9:
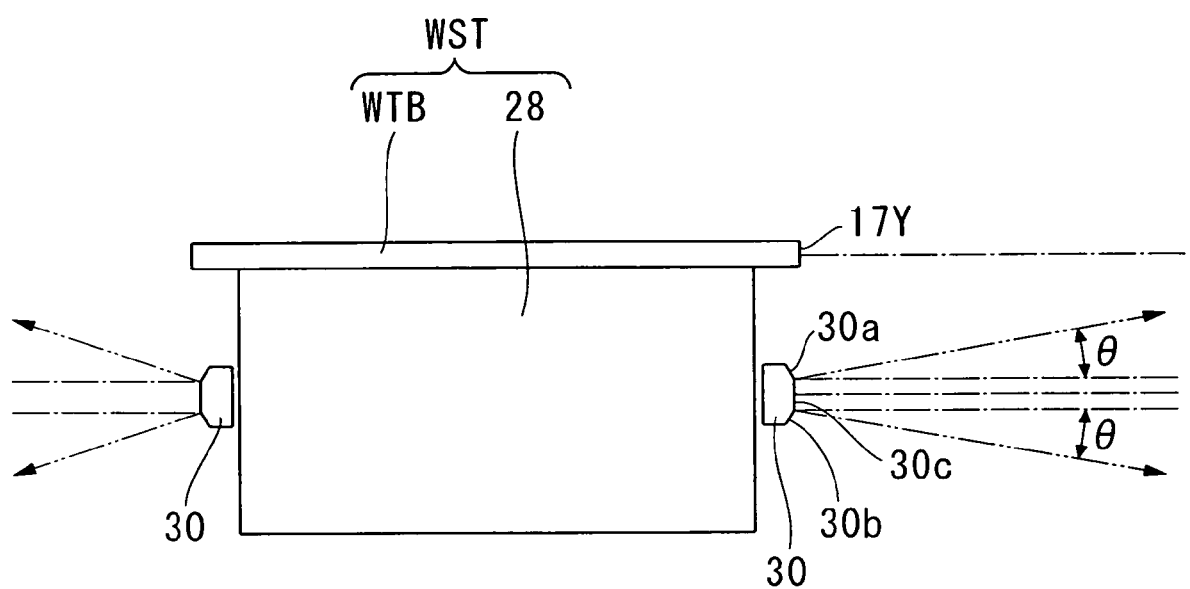
FIG. 9 shows a constitution wherein a movable mirror is provided on each side of the wafer stage so that it is interposed therebetween.

In addition, the abovementioned embodiment is constituted so that the movable mirror 30 is disposed, for example, only on one side (the +Y side) of the wafer stage WST, but may be constituted so that a movable mirror 30 is also provided on the −Y side of the wafer stage WST so that such is interposed therebetween, as shown in, for example, FIG. 9. With this constitution, by measuring the Z position of the wafer stage WST at two locations using the movable mirror 30 on the +Y side and measuring the Z position at one location using the movable mirror 30 on the −Y side, it is possible to measure the Z position in an interposed state at three locations, which includes the exposure area, and to achieve higher precision measurement, including measurement of the amount of rolling and the amount of pitching.

In addition, the abovementioned embodiment is constituted so that the stage apparatus 50 comprises both the wafer stage WST and the measurement stage MST, but the present invention may also be adapted to a constitution wherein only the wafer stage WST is provided. Furthermore, the abovementioned embodiment is constituted so that the present invention is adapted to a stage apparatus 50 on the wafer W side, but can also be adapted to a reticle stage RST on the reticle R side.

The exposure apparatus 100 can also be adapted to a scanning type exposure apparatus that does not use the liquid immersion method, and to a step-and-repeat type projection exposure apparatus (stepper) that exposes the full pattern of the reticle R with the reticle R and the wafer W in a stationary state, and sequentially steps the wafer W. In addition, the exposure apparatus 100 can also be adapted to a step-and-stitch type exposure apparatus that partially and superposingly transfers at least two patterns onto the wafer W. In addition, the exposure apparatus 100 can also be adapted to a proximity exposure apparatus that exposes the pattern of a mask by bringing the mask and a substrate into close contact, without using a projection optical system.

The following explains another embodiment of the present invention, referencing the drawings.

Figure 10:
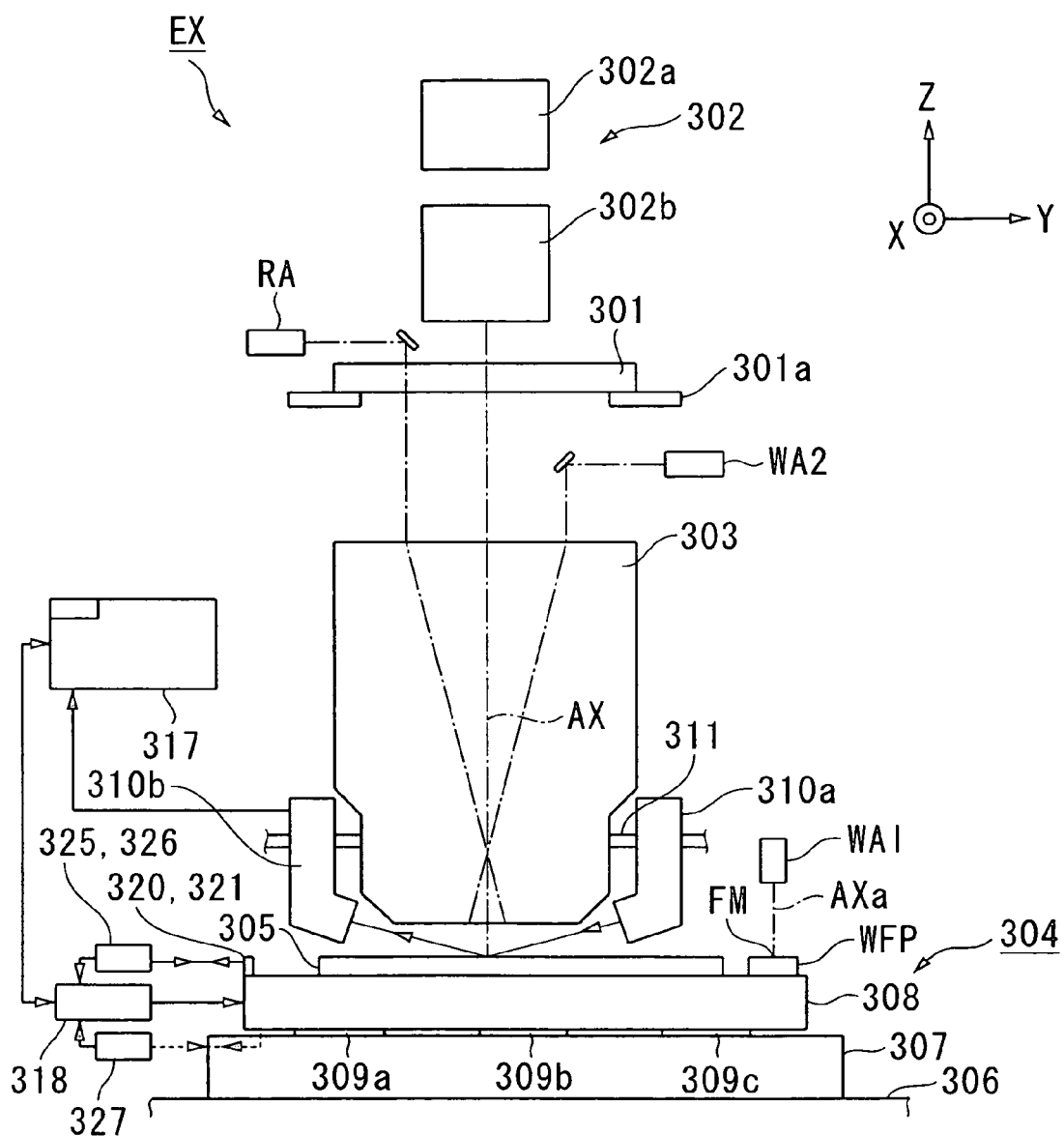
FIG. 10 is a schematic block diagram that shows the exposure apparatus according to another embodiment.

FIG. 10 is a schematic block diagram that shows the exposure apparatus according to the present embodiment. In FIG. 10, an exposure apparatus EX is a step-and-repeat type exposure apparatus that transfers a circuit pattern formed in a reticle 301 (mask) to a wafer 305 (substrate) in a state wherein the reticle 301 and the wafer 305 are stationary, and then successively steps the wafer 305.

Furthermore, the following explanation sets the XYZ orthogonal coordinate system indicated in FIG. 10, and explains the positional relationships of each member referencing that XYZ orthogonal coordinate system. The XYZ orthogonal coordinate system is set so that the X and Y axes are parallel to the front surface of the wafer 305 and the Z axis is in a direction orthogonal to the front surface of the wafer 305 (i.e., in a direction parallel to the optical axis AX of the projection optical system 303). The XYZ coordinate system in the figure is set so that the XY plane is actually parallel to the horizontal plane and the Z axis is in the vertical direction.

A light source 302a of an illumination apparatus 302 generates pulsed illumination light for exposure, e.g., it is possible to use: the bright lines (for example, the g line at a wavelength of 436 nm, or the i line at a wavelength of 365 nm) of ultraviolet rays emitted from, for example, an ultrahigh pressure mercury vapor lamp; ultraviolet pulsed light emitted from a KrF excimer laser light source with a 248 nm wavelength; ultraviolet pulsed light emitted from an ArF excimer laser light source with a 193 nm wavelength; and ultraviolet rays, wherein the pulsed laser light emitted from a YAG laser light source is converted to higher harmonics.

The light emitted from the light source 302a uniformly illuminates the reticle 301 through an illumination optical system 302b. Although a detailed drawing is omitted, in the illumination optical system 302b, the light from the light source 302a is irradiated to a beam shaping optical system through a rotary shutter, the illumination light that emerges from the beam shaping optical system enters a fly-eye lens system, which functions as an optical integrator, and numerous two dimensional light source images at the emergent side thereof are uniformly distributed within an area that is overall substantially square or circular. An aperture stop switching member, wherein a plurality of illumination aperture stops (σ stops) are installed that modify the effective shape of the two dimensional light source images to create illumination that is, for example, annular, small circular, normal circular, or quadrupole, is disposed on the emergent side of the fly-eye lens system, and a motor drives this switching member so that it switches to the desired illumination aperture stop (σ stop).

The illumination light that transmits through the illumination aperture stop (σ stop) transmits through a beam splitter, which has a reflectance of, for example, substantially 10% or less, is reflected by a mirror, enters a relay lens system, and then illuminates a movable reticle blind, which determines the shape and/or the position of the illumination area on the reticle 301, with a uniform luminous flux intensity distribution. The illumination light that transmits through the opening of the reticle blind travels via, for example, the relay lens system, the mirror, and a main condenser lens system, and then irradiates a circuit pattern area of the reticle 301 with a uniform intensity distribution.

The reticle 301 is held parallel to the XY plane on a reticle stage 301a via a reticle holder (not shown). The circuit pattern to be transferred is formed in the reticle 301, and the entirety of the pattern area is illuminated if using a step-and-repeat type exposure apparatus. Furthermore, the reticle 301 is appropriately exchanged by an exchanging apparatus (not shown).

The light that passes through the pattern formed in the reticle 301 forms a pattern image on the photosensitive wafer 305 through a projection optical system 303. The wafer 305 is vacuum chucked on a wafer stage 304 via a wafer table 308 so that it is parallel to the XY plane. The pattern image is formed in an exposure area on the wafer 305, which optically corresponds to the illumination area on the reticle 301.

Furthermore, the projection optical system 303 in the present example is a dioptric system, but of course a catadioptric system or a catoptric system can also be used. In addition, the projection optical system 303 is optimally aberration corrected with respect to the wavelength of the exposure illumination light under the conditions of a prescribed atmospheric temperature (e.g., 25° C.) and a prescribed atmospheric pressure (e.g., 1 atm), and the reticle 301 and the wafer 305 are optically conjugate under such conditions. In addition, the exposure illumination light is Kohler illumination, wherein an image of the light source is formed at the center of the pupil plane of the projection optical system 303. Furthermore, the projection optical system 303 comprises a plurality of optical elements, such as lenses, and the glass material of these optical elements is selected from optical materials, such as quartz and fluorite, in accordance with the wavelength of the exposure illumination light.

The wafer stage 304 is provided on a base plate 306 and moves two dimensionally along the XY plane parallel to an imaging plane of the projection optical system 303 by the control of a drive control unit 318. Namely, the wafer stage 304 comprises a wafer table 308, which serves as a sample platform that holds the wafer 305, and an XY stage 307, which serves as a movable part and moves two dimensionally along the XY plane on the base plate 306. The XY stage 307 steps in the X and Y directions.

Movable mirrors 320, 321, which extend in the X and Y directions, are attached to one end of the wafer stage 304 (wafer table 308). An X axis laser interferometer system 325 and a Y axis laser interferometer system 326 are provided opposing the mirror surface of the movable mirrors 320, 321. The interferometer systems 325, 326 measure the position in the X and Y directions as well as the rotational angles of the wafer stage 304 about the X, Y, and Z axes in real time. The drive control unit 318 controls the velocity and the position of the wafer stage 304 based on the measurement results of the interferometer systems 325, 326 and control information from a main control system 317.

Furthermore, a Z leveling mechanism, which controls the position (focus position) in the Z axial direction as well as the inclination angles of the wafer 305 about the X and Y axes, is also incorporated in the wafer stage 304. Namely, the wafer table 308 is held on the XY stage 307 via three actuators 309a, 309b, 309c, which displace the wafer table 308 in the Z direction.

The three actuators 309a, 309b, 309c are distributively disposed so that they do not form a straight line. In addition, the drive control unit 318 controls the drive quantity of each of the actuators 309a, 309b, 309c based on the control information from the main control system 317. By driving the three actuators 309a, 309b, 309c by the same amount, it is possible to move the wafer table 308 parallel to the Z direction, and it is also possible to incline the wafer table 308 with respect to the XY plane by making each of the amounts of drive different. The front surface of the wafer 305 can be focused on with high precision at the projected image position (the imaging position of the pattern image) of the reticle 301 by appropriately controlling the drive quantities of the three actuators 309a, 309b, 309c. The wafer table 308 may be made movable in the directions of the six degrees of freedom.

A focal point position detection system sensor 310a, 310b, which serves as an auto focus sensor, detects the focus state of the projection optical system 303 on the wafer 305. The focal point position detection system sensor 310a, 310b comprises: the light sending optical system 310a that supplies an imaging light beam from a diagonal direction with respect to the optical axis AX of the projection optical system 303 toward the imaging plane of the projection optical system 303 in order to form a pinhole or a slit shaped image; and the light receiving optical system 310b that receives that imaging light beam, which is reflected by the front surface of the wafer 305. For example, these optical systems 310a, 310b are fixed to a platform 311 (column) to which the projection optical system 303 is installed.

The information related to the position in the Z direction and/or the attitude of the wafer table 308 is measured by a Z axis laser interferometer system 327 in addition to the above-mentioned focal point position detection system sensor 310a, 310b. The measurements made using the interferometer are advantageous in that they have a comparatively superior responsiveness and resolving power.

Figure 11:
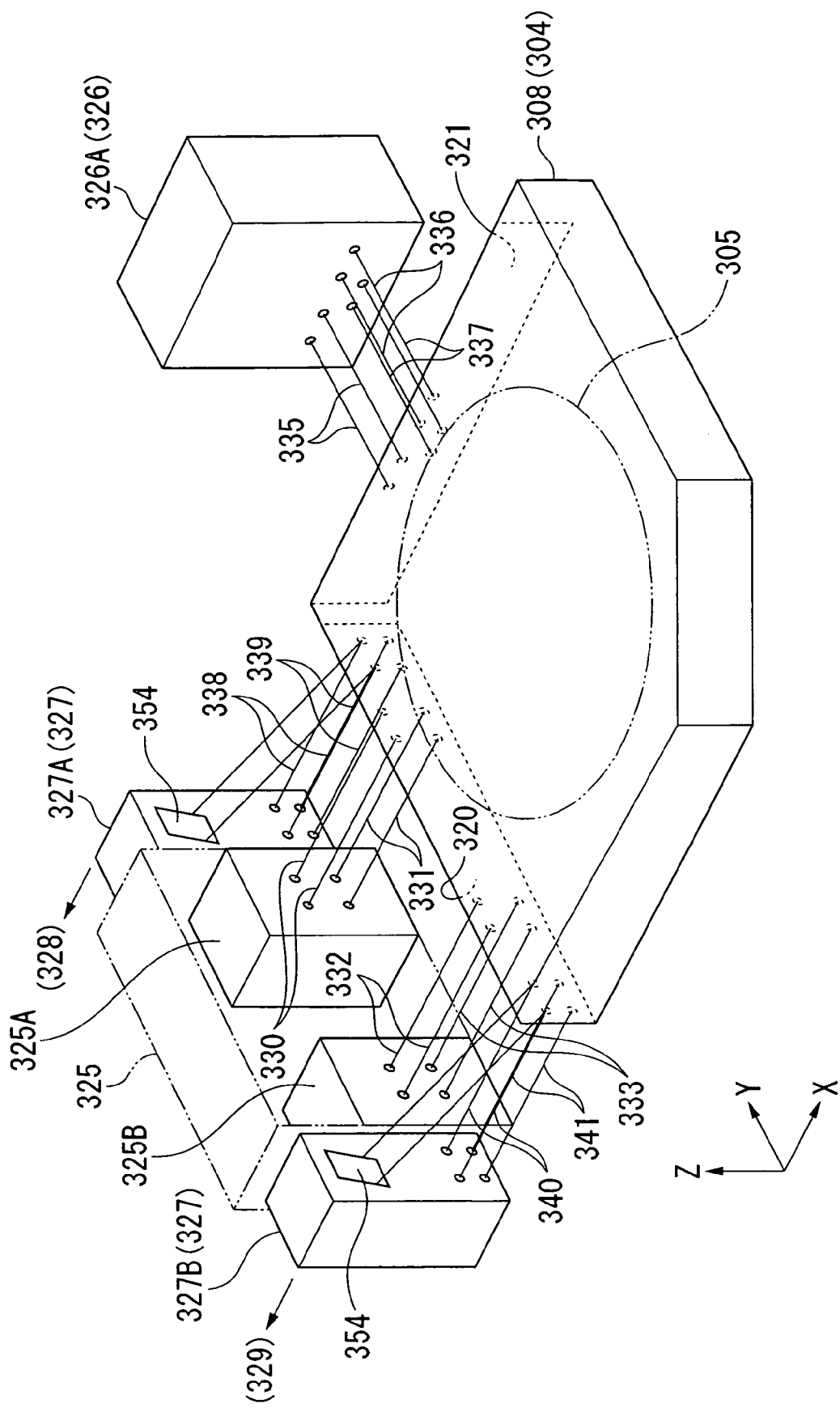
FIG. 11 is a layout drawing of an interferometer system.

FIG. 11 is a layout drawing of the X axis laser interferometer system 325, the Y axis laser interferometer system 326, and the Z axis laser interferometer system 327.

As shown in FIG. 11, the X axis laser interferometer system 325 comprises two interferometer optical systems 325A, 325B, which are disposed mutually spaced apart in the Y direction. The interferometer optical system 325A and the interferometer optical system 325B are selectively used in accordance with, for example, the position of the wafer table 308 (wafer stage 304) in the Y direction. The arrangement and position of the interferometer optical system 325A with respect to the Y direction generally coincides with the optical axis AX of the projection optical system 303 (refer to FIG. 10). The arrangement and position of the interferometer optical system 325B in the Y direction generally coincides with an optical axis AXa (refer to FIG. 10) of a wafer alignment system sensor WA1, which is discussed later. The interferometer optical system 325A is used when performing the exposure process upon the wafer 305 through the projection optical system 303 (refer to FIG. 10), and the interferometer optical system 325B is used when measuring a mark on the wafer stage 304 through the wafer alignment system sensor WA1 (refer to FIG. 10).

The X axis laser interferometer system 325 (interferometer optical systems 325A and 325B), the Y axis laser interferometer system 326 (interferometer optical system 326A), and the Z axis laser interferometer system 327 (interferometer optical systems 327A and 327B) shown in FIG. 11 can be provided, for example, to the platform 311 to which the projection optical system 303 is installed. In addition, these interferometer systems may be installed on, for example, a measurement frame, which is isolated from vibrations. In addition, fixed mirrors 354 can also be provided at the locations where the interferometer systems are installed.

Each of the interferometer optical systems 325A, 325B irradiates a plurality of laser beams (330, 331, 332, 333), each of which has an optical axis parallel to the X direction, to the movable mirror 320, which is provided to and disposed on the wafer table 308 (wafer stage 304). The reflected beams from the movable mirror 320 are sent via the interferometer optical systems 325A, 325B to a photoelectric conversion device (not shown), which detects the position of the movable mirror 320 at each irradiation location in the X direction.

Specifically, among the plurality of beams 330, 331 irradiated to the movable mirror 320 through the interferometer optical system 325A, the beam 330 is used to measure the position of the wafer table 308 in the X direction. In addition, the beam 330 and the beam 331 are used to measure the rotational angle of the wafer table 308 about the Y axis (roll). Likewise, among the plurality of beams 332, 333 irradiated to the movable mirror 320 through the interferometer optical system 325B, the beam 332 is used to measure the position of the wafer table 308 in the X direction. In addition, the beam 332 and the beam 333 are used to measure the rotational angle of the wafer table 308 about the Y axis (roll).

The Y axis laser interferometer system 326 comprises the interferometer optical system 326A. The arrangement and position of the interferometer optical system 326A in the X direction generally coincides with the optical axis AX (refer to FIG. 10) of the projection optical system 303. The interferometer optical system 326A irradiates a plurality of laser beams (335, 336, 337), each of which has an optical axis parallel to the Y direction, to the movable mirror 321, which is provided to and disposed on the wafer table 308 (wafer stage 304). The reflected beams from the movable mirror 321 are sent via the interferometer optical systems 325A, 325B to a photoelectric conversion device (not shown), which detects the position at each irradiation location of the movable mirror 321 in the Y direction.

Specifically, among the plurality of beams 335, 336, 337 irradiated to the movable mirror 321 through the interferometer optical system 326A, the beam 335 and the beam 336 are used to measure the position of the wafer table 308 in the Y direction, and are also used to measure the rotational angle of the wafer table 308 about the Z axis (yaw). Furthermore, the beam 335, the beam 336, and the beam 337 are used to measure the rotational angle of the wafer table 308 about the X axis (pitch).

The Z axis laser interferometer system 327 comprises two interferometer optical systems 327A, 327B, which are disposed mutually spaced apart in the Y direction. The interferometer optical system 327A and the interferometer optical system 327B are selectively used in accordance with, for example, the position of the wafer table 308 (wafer stage 304) in the Y direction. The interferometer optical system 327A is used when performing the exposure process upon the wafer 305 through the projection optical system 303 (refer to FIG. 10). The interferometer optical system 325B is used when measuring a mark on the wafer stage 304 or the wafer 305 through the wafer alignment system sensor WA1 (refer to FIG. 10).

The interferometer optical systems 327A, 327B irradiate a plurality of laser beams (338, 339, 340, 341), each of which has an optical axis parallel to the X direction, to the movable mirror 320, which is provided and arranged to the wafer table 308 (wafer stage 304). The reflected beams from the movable mirror 320 and the fixed mirror 354 (the roof mirror, which is discussed later) are sent via the interferometer optical systems 325A, 325B to photoelectric conversion devices 328, 329, which detect the position of the wafer table 308 in the Z direction.

Specifically, among the plurality of beams 340, 341 irradiated to the movable mirror 320 through the interferometer optical system 327B, the beam 340 is reflected and bent by the movable mirror 320, and then irradiated to the fixed mirror 354. The reflected beam from the fixed mirror 354 is reflected and bent by the movable mirror 320, returns to the interferometer optical system 327B, and is sent to the photoelectric conversion device 329. In addition, the other beam 341 from the interferometer optical system 327B is reflected by the movable mirror 320, returns to the interferometer optical system 327B, and is sent to the photoelectric conversion device 329. Attendant with the movement of the wafer table 308 in the Z direction, the optical path lengths of the beam 340 and the beam 341 change relative to one another. Based on this relative change, it is possible to measure the amount of positional fluctuation of the wafer table 308 in the Z direction. The same applies to the interferometer optical system 327A. The following provides a more detailed explanation of the constitution of the interferometer optical system 327B.

Figure 12:
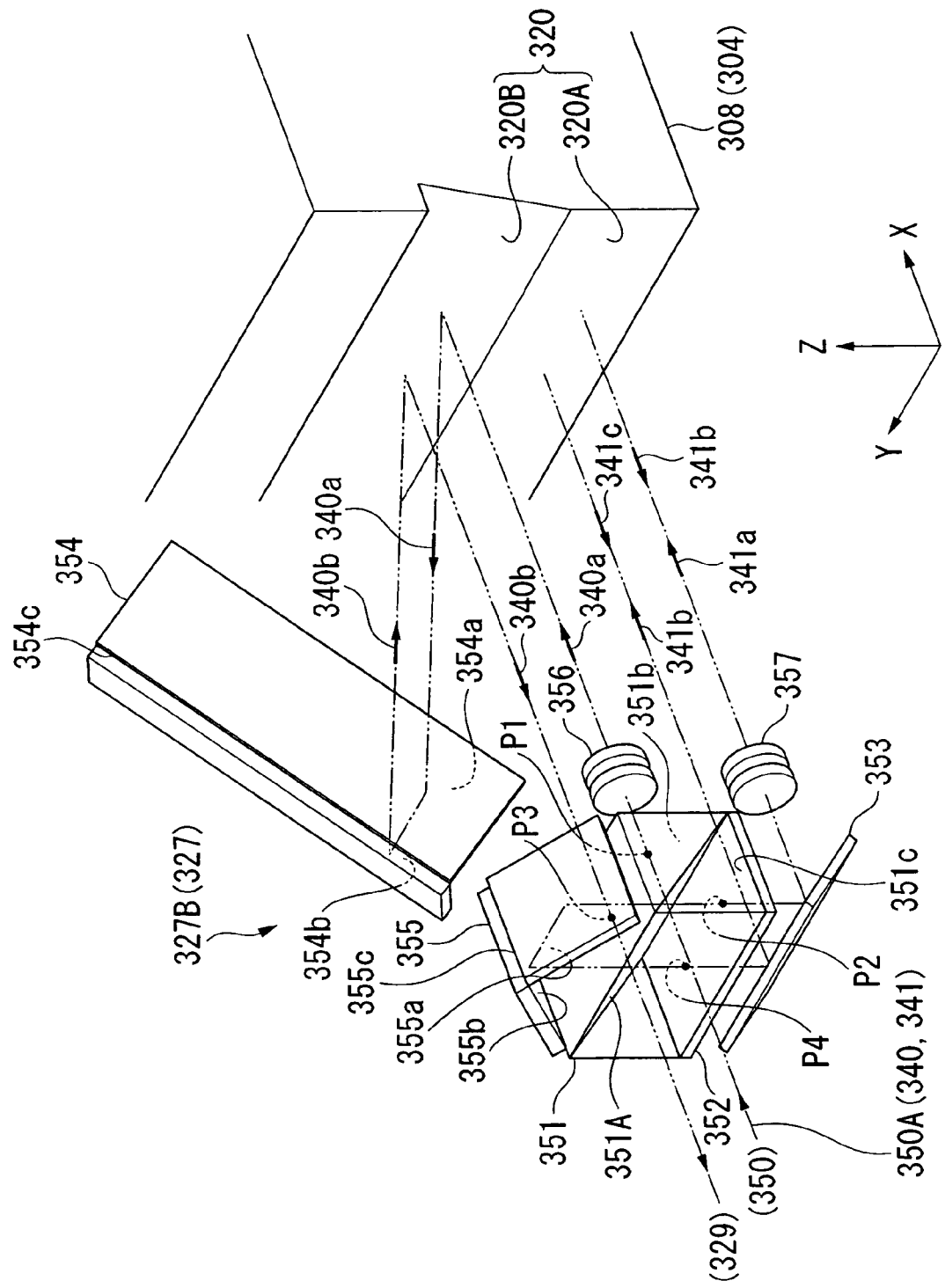
FIG. 12 is a schematic oblique view that shows the constitution of an interferometer optical system.

FIG. 12 is a schematic oblique view that shows the constitution of the interferometer optical system 327B in the Z axis laser interferometer system 327, and FIG. 13 is a schematic side view that shows the constitution of the interferometer optical system 327B.

As shown in FIG. 12 and FIG. 13, the interferometer optical system 327B comprises a polarizing beam splitter 351, a quarter-wave plate 352, a bending mirror 353, roof mirrors 354, 355, and adjustment mechanisms 356, 357, which adjust the optical axis of the beams.

A laser beam 350A from a laser light source 350 enters the interferometer optical system 327B. This laser beam 350A includes a pair of wavelength stabilized polarized light components, wherein the polarized light directions are mutually orthogonal. Furthermore, for the sake of convenience in explaining the present embodiment, one polarized light component (the S polarized light component with a frequency component F1) of the laser beam 350A emitted from the laser light source 350 is generically called the reference beam 341, and the other polarized light component (the P polarized light component with a frequency component F2) is generically called the measuring beam 340, but these may be reversed.

The laser beam 350A from the laser light source 350 proceeds in the +X direction within the XY plane, impinges a polarizing surface 351a of the polarizing beam splitter 351, which splits the laser beam 350A into orthogonal polarized light components, i.e., the two frequency components (P polarized light component and S polarized light component).

Among these polarized light components, the measuring beam 340, which is the P polarized light component, transmits through the polarizing surface 351a of the polarizing beam splitter 351, proceeds in the +X direction, and emerges (as a measuring beam 340a) from an emergent position P1 of a first surface 351b of the polarizing beam splitter 351. On the other hand, the reference beam 341, which is the S polarized light component, is reflected and bent by the polarizing surface 351a of the polarizing beam splitter 351, proceeds in the −Z direction, and emerges (as a reference beam 341a) from an emergent position P2 of a second surface 351c of the polarizing beam splitter 351.

The measuring beam 340a that emerges from the polarizing beam splitter 351 is irradiated to the movable mirror 320 of the wafer table 308. The adjustment mechanism 356, which adjusts the optical axis of the measuring beam 340a, is provided and disposed along the optical path of the measuring beam 340a between the polarizing beam splitter 351 and the wafer table 308. On the other hand, the reference beam 341a that emerges from the polarizing beam splitter 351 is converted to circularly polarized light by the quarter-wave plate 352, is subsequently bent 90° by the bending mirror 353, proceeds in the +X direction, and is then irradiated to the movable mirror 320 of the wafer table 308. The adjustment mechanism 357, which adjusts the optical axis of the reference beam 341a, is provided and disposed along the optical path of the reference beam 341a between the bending mirror 353 and the wafer table 308. The adjustment mechanisms 356, 357 comprise two opposingly disposed deflecting lenses, and a fixture (not shown) for holding and fixing each of these deflecting lenses. The adjustment mechanisms 356, 357 can adjust the degree of parallelism of the measuring beam 340a and the reference beam 341a by changing the relative positions (rotational positions about the optical axes) of the two deflecting lenses to shift their optical axes. Furthermore, in the example shown in FIG. 12 and FIG. 13, the adjustment mechanisms 356, 357 are disposed along the optical paths of the measuring beam 340a and the reference beam 341a, respectively, but may be disposed along the optical path of just one of the measuring beam 340a and the reference beam 341a.

The movable mirror 320, which is provided to the wafer stage 304 (wafer table 308), comprises a first reflecting surface 320A, which is disposed parallel to the YZ plane, and a second reflecting surface 320B, which is disposed parallel to the Y axis and inclined with respect to the YZ plane. The measuring beam 340a from the polarizing beam splitter 351 is irradiated to the second reflecting surface 320B of the movable mirror 320, is bent at a prescribed angle thereby, and then proceeds diagonally upwards in the −X direction.

The roof mirror 354 is provided and disposed at the destination of the measuring beam 340a, which was reflected by the movable mirror 320 (second reflecting surface 320B). The measuring beam 340a reflected by the second reflecting surface 320B of the movable mirror 320 proceeds in the X direction with an inclination of a prescribed angle, which is the irradiation direction of the beam from the polarizing beam splitter 351, and then impinges upon the roof mirror 354. The roof mirror 354 is disposed spaced apart from the polarizing beam splitter 351 at an upper position (in the +Z direction), and comprises two reflecting surfaces 354a, 354b, which mutually form a narrow angle of 90°. A line of intersection 354c of these two reflecting surfaces 354a, 354b lies within the XZ plane and is perpendicular to the travel direction of the measuring beam 340a reflected by the movable mirror 320 (second reflecting surface 320B). Furthermore, attendant with the movement of the wafer stage 304 (wafer table 308) in the X direction as well as in the Z direction, the irradiation position of the measuring beam 340a with respect to the roof mirror 354 changes to the abovementioned line of intersection direction. The length to which the roof mirror 354 extends in the abovementioned line of intersection direction is determined based on the range of motion of the wafer stage 304 (wafer table 308) in the X direction.

Figure 14A:
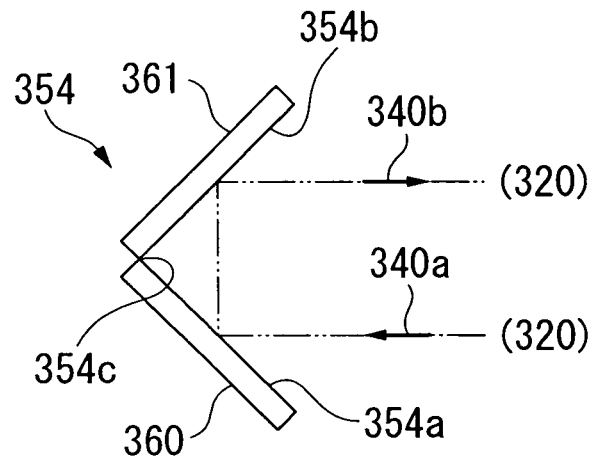
FIG. 14A is a schematic drawing that shows an embodiment of a roof mirror.
Figure 14B:
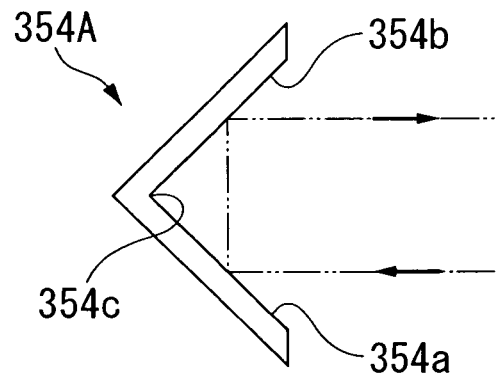
FIG. 14B is a schematic drawing that shows a modified example of the roof mirror.
Figure 14C:
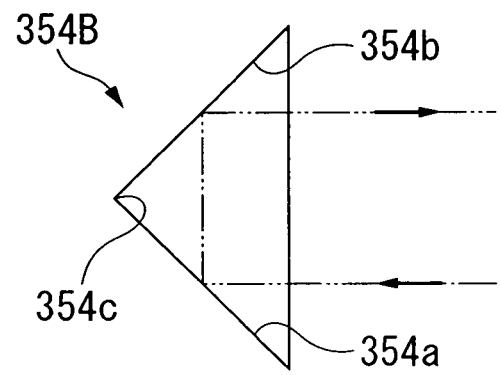
FIG. 14C is a schematic drawing that shows an embodiment of a roof prism as a modified example of the roof mirror.

FIG. 14A-FIG. 14C show embodiments and modified examples of the roof mirror 354.

FIG. 14A shows the roof mirror 354, which comprises a combination of two mirrors 360, 361. The reflecting surface 354a of the mirror 360 and the reflecting surface 354b of the mirror 361 form a narrow angle of 90°. The mirror 360 and the mirror 361 may be separated. In this case, the abovementioned line of intersection becomes a virtual line. Each of the mirrors (360, 361) are fixed to a support body (not shown) by, for example, an adhesive or a metal spring.

FIG. 14B is a modified example of FIG. 14A and shows a roof mirror 354A that has an integrated structure. The two reflecting surfaces 354a, 354b, which mutually form a narrow angle of 90°, are formed on the roof mirror 354A.

FIG. 14C is a modified example of FIG. 14A, and shows a roof prism 354B that has an integrated structure. The two reflecting surfaces 354a, 354b, which mutually form a narrow angle of 90°, are formed on the roof prism 354B. Glass or quartz glass is used as the forming material of the roof prism 354B, and it is preferable to use a material with a low relative index of refraction and a low rate of change in temperature.

Returning to FIG. 12 and FIG. 13, the measuring beam 340a that impinged upon the roof mirror 354 is retroreflected attendant with the shift in the optical axis, and then returns from the roof mirror 354 to the movable mirror 320. Specifically, the measuring beam 340a from the movable mirror 320 is bent 90° by the reflecting surface 354a of the roof mirror 354, proceeds in the +Y direction, and then impinges upon the reflecting surface 354b. The measuring beam 340a is bent 90° by the reflecting surface 354b, and proceeds diagonally downward in the +X direction toward the movable mirror 320 (as a measuring beam 340b, refer to FIG. 14A). The measuring beam 340a that impinges upon the roof mirror 354 and the measuring beam 340b that emerges from the roof mirror 354 are parallel, and the optical axis of the emergent beam is shifted in the +Y direction parallel to the optical axis of the incident beam. Namely, the roof mirror 354 twice reflects the measuring beam 340a from the movable mirror 320, thereby shifting the optical axis (optical path) of the measuring beam 340a in the +Y direction, which is a direction orthogonal to the line of intersection 354c of the two reflecting surfaces 354a, 354b, and the measuring beam 340a then returns to the movable mirror 320.

Furthermore, to facilitate understanding of the invention, the beam 340a and the beam 340b, which are spaced apart in the Y direction and are parallel to one another, are drawn in FIG. 13 so that they are clearly separated in the Z direction, but the Z positions of the beam 340a and the beam 340b are actually the same. Hereinbelow, the same applies with respect to parallel beams that are spaced apart in the Y direction.

The measuring beam 340b that emerges from the roof mirror 354 is bent at a prescribed angle by the second reflecting surface 320B of the movable mirror 320, and then proceeds in the −X direction toward the polarizing beam splitter 351. The measuring beam 340b transmits through the polarizing beam splitter 351, further proceeds in the −X direction, and then enters the photoelectric conversion device 329. Furthermore, an incident position P3 of the measuring beam 340b that returns from the movable mirror 320 and the emergent position P1 of the measuring beam 340a on the first surface 351b of the polarizing beam splitter 351 are different. Namely, P3 is shifted in the +Y direction with respect to P1.

Meanwhile, the reference beam 341a from the bending mirror 353 is irradiated to the first reflecting surface 320A of the movable mirror 320, and is reflected by the first reflecting surface 320A (as a reference beam 341b). The reference beam 341b proceeds in the −X direction, which is a direction that is the reverse of the original travel direction, is bent 90° by the bending mirror 353, and then proceeds in the +Z direction. Furthermore, the reference beam 341b once again enters the quarter-wave plate 352, passes therethrough, and is thereby converted to linearly polarized light that has a polarized light direction that is orthogonal to the original polarized light direction. The reference beam 341b enters the second surface 351c of the polarizing beam splitter 351. The incident position of the reference beam 341b, which returns from the movable mirror 320, is the same as the emergent position P2 of the initial reference beam 341a at the second surface 351c of the polarizing beam splitter 351.

The reference beam 341b that returns from the polarizing beam splitter 351 this time transmits through the polarizing surface 351a. The roof mirror 355 is provided and disposed at the destination of the reference beam 341b. The roof mirror 355 is shaped the same as the previous discussed roof mirror 354 (refer to FIG. 14A-14C). Namely, the roof mirror 355 is disposed proximate to the polarizing beam splitter 351 at an upper position (in the +Z direction), and comprises two reflecting surfaces 355a, 355b that mutually form a narrow angle of 90°. A line of intersection 355c of these two reflecting surfaces 355a, 355b is parallel to the X direction, and lies within the XY plane and the XZ plane.

Furthermore, FIG. 12, 13, and the like show a state wherein the polarizing beam splitter 351 and the roof mirror 355 are separated, but they may be integrated by, for example, joining both together. In particular, if using a roof prism as shown in FIG. 14C, then it is possible to integrate this prism and the polarizing beam splitter 351 by, for example, bonding.

The reference beam 341b that enters the roof mirror 355 returns from the roof mirror 355 to the polarizing beam splitter 351 via retroreflection that is attendant with a shift in the optical axis. Specifically, the reference beam 341b is bent 90° by the reflecting surface 355a of the roof mirror 355, proceeds in the +Y direction, and enters the reflecting surface 355b. Furthermore, the reference beam 341b is bent 90° by the reflecting surface 355b, and proceeds in the −Z direction toward the polarizing beam splitter 351. The reference beam 341b that impinges upon the roof mirror 355 and the reference beam 341b that emerges therefrom are mutually parallel, and the optical axis of the emergent beam is shifted in the +Y direction parallel to the optical axis of the incident beam. Namely, the reference beam 341b from the polarizing beam splitter 351 is reflected twice by the roof mirror 355, thereby shifting its optical axis (optical path) in the +Y direction, which is a direction orthogonal to the line of intersection 355c of the two reflecting surfaces 355a, 355b, and returns to the polarizing beam splitter 351. The direction and amount of shift of the reference beam 341b by the roof mirror 355 are the same as those of the measuring beam 340a by the previously discussed roof mirror 354.

The reference beam 341b from the roof mirror 355 once again transmits through the polarizing surface 351a of the polarizing beam splitter 351, proceeds in the −Z direction, and emerges from the second surface 351c. At the second surface 351c of the polarizing beam splitter 351, an emergent position P4, which is where the reference beam 341b emerges a second time, is different than the emergent position P2, which is where the reference beam 341b emerges the first time. Namely, P4 is shifted in the +Y direction with respect to P2.

The reference beam 341b that emerges from the polarizing beam splitter 351 is reconverted to circularly polarized light by the quarter-wave plate 352, is subsequently bent 90° by the bending mirror 353, and then proceeds in the +X direction. Thereafter, the reference beam 341b is irradiated to the first reflecting surface 320A of the movable mirror 320 of the wafer table 308, and is reflected by that first reflecting surface 320A (as a reference beam 341c). The reference beam 341c reflected by the first reflecting surface 320A proceeds in the −X direction, which is a direction that is the reverse of the original travel direction, is bent 90° by the bending mirror 353, and proceeds in the +Z direction. Subsequently, the reference beam 341b once again enters the quarter-wave plate 352, passes therethrough, and is thereby converted to linearly polarized light (P polarized light) that has a polarized light direction that is the same as the original polarized light direction. The reference beam 341c enters the second surface 351c of the polarizing beam splitter 351. The incident position of the reference beam 341c, which has returned from the movable mirror 320 for the second time, is the same as the emergent position P4 thereof at the second surface 351c of the polarizing beam splitter 351, and differs from the first time emergent position P2 (and the incident position of the beam that returns the first time).

The reference beam 341c that once again impinges upon the polarizing beam splitter 351 this time is reflected and bent by the polarizing surface 351a of the polarizing beam splitter 351, proceeds in the −X direction, and enters the photoelectric conversion device 329. The photoelectric conversion device 329 measures the amount of positional fluctuation of the wafer table 308 in the Z direction based on the interference light between the reference beam 341c and the measuring beam 340b, which are both return beams.

For example, a polarizer causes both polarized light components (the measuring beam 340b and the reference beam 341c) to interfere inside the photoelectric conversion device 329, and that interference light is detected by a photoelectric device, its frequency is converted to an F2-F1 electrical signal, which is sent to a phase detecting means (not shown). This phase detecting means is a phase meter that detects the absolute phase difference between a measurement signal and a reference signal sent from the laser light source 350. Namely, the interference light photoelectrically converted by the photoelectric conversion device 329 is input from the photoelectric conversion device 329 to the phase detecting means as a measurement signal, which has a frequency that is the sum of the F2-F1 beat frequency and the frequency change ΔF(t) of the Doppler effect portion, which is generated attendant with fluctuations in the spacing (distance) between the movable mirror 320 and the roof mirror 355 that serves as a fixed mirror. Moreover, a signal, which has the F2-F1 beat frequency obtained by the mutual interference of the light of frequency F1 (reference beam 41) and the light of frequency F2 (measuring beam 40) from the laser light source 350, is input to the phase detecting means as a reference signal. The phase detecting means detects the phase difference between the reference signal and the measurement signal, and integrates the variation in that phase difference, thereby deriving a signal that is proportional to the variation in the spacing between the roof mirror 355 and the movable mirror 320. Namely, if the spacing in the Z direction between the movable mirror 320 and the roof mirror 355, which serves as a fixed mirror, fluctuates, then the absolute phase also varies proportional therewith, and it is therefore possible to measure the fluctuations of the spacing in the Z direction based on the absolute phase difference (the amount of positional fluctuation of the wafer table 308 in the Z direction).

Figure 15:
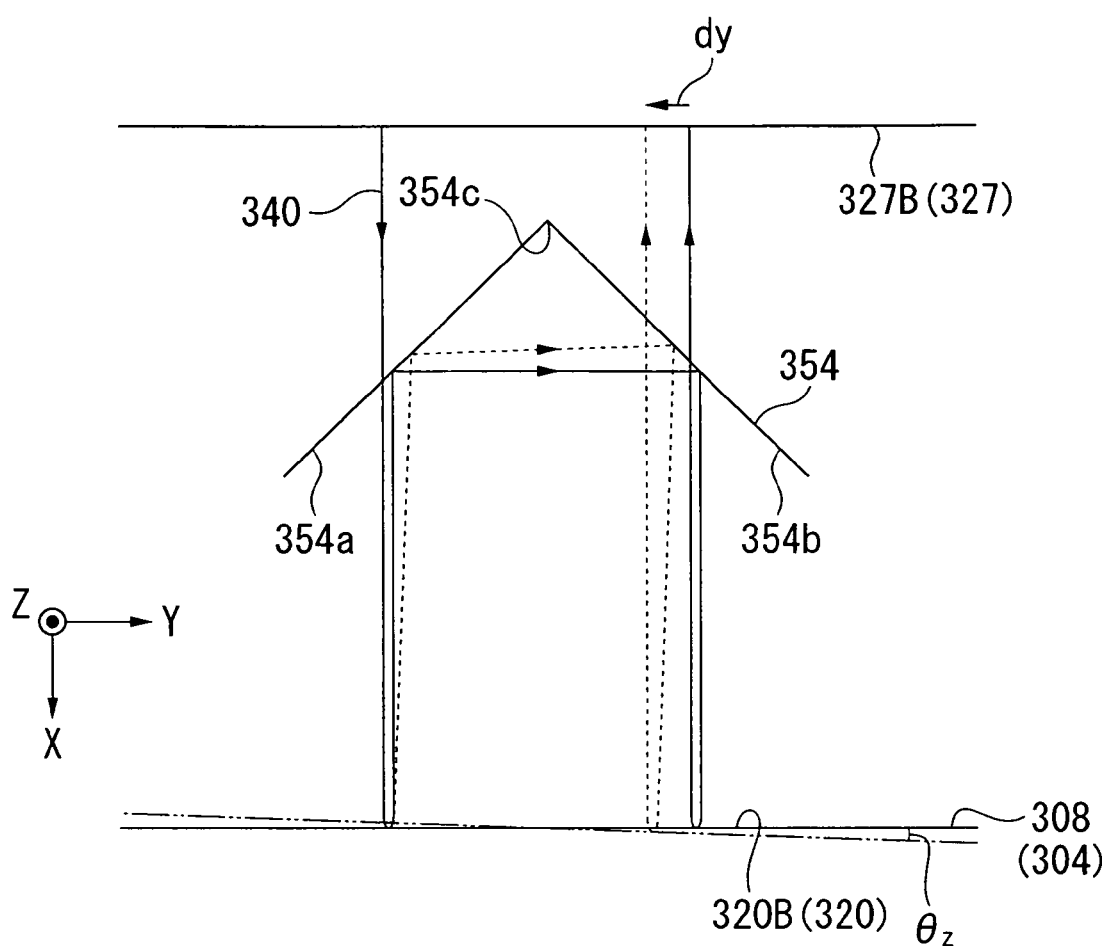
FIG. 15 schematically shows the change in the optical path of a measuring beam of the interferometer system when the attitude of a wafer table changes.

FIG. 15 schematically shows the change in the optical path of the measuring beam 340 in the Z axis laser interferometer system 327 when the attitude of the wafer table 308 (wafer stage 304) has changed. Furthermore, in FIG. 15, the optical path of the measuring beam 340 at the reference attitude is drawn with a solid arrow.

As shown in FIG. 15, if there is a change in the rotational angle θz (yaw) of the wafer table 308 about the Z axis, then the measuring beam 340 reflected by the second reflecting surface 320B of the movable mirror 320 is inclined with respect to the reference optical path in accordance with the rotational angle θz of the wafer table 308, and enters the roof mirror 354, as shown by the broken line in FIG. 15. Consequently, the incident angle of the measuring beam 340 with respect to each of the reflecting surfaces 354a, 354b of the roof mirror 354 differs from that of the reference optical path. Nevertheless, by being reflected twice by the roof mirror 354, the travel direction of the measuring beam 340 that returned from the roof mirror 354 to the movable mirror 320 is a direction that is the same as the reverse direction of the travel direction of the measuring beam 340 that proceeds from the movable mirror 320 to the roof mirror 354. Namely, even if the rotational angle θz of the wafer table 308 changes, a state wherein the beam that enters the roof mirror 354 and the beam that emerges therefrom are parallel is maintained due to the retroreflection that is attendant with the shift of the optical axes of the beams in the roof mirror 354. The return measuring beam 340 that was reflected by the second reflecting surface 320B of the movable mirror 320 returns to the interferometer optical system 327A at an angle that is the same as the reference optical path. Namely, with this Z axis laser interferometer system 327, the measuring beam 340 is reflected twice by both the movable mirror 320 and the roof mirror 354, which serves as a fixed mirror, and therefore an angular deviation of the measuring beam 340 in the return direction is prevented even if the rotational angle θz of the wafer table 308 changes.

Furthermore, the second reflecting surface 320B of the movable mirror 320 is actually disposed (refer to FIG. 13) parallel to the Y axis and inclined with respect to the YZ plane, as discussed earlier. Accordingly, the effect of preventing angular deviation due to the abovementioned two time reflection is applied to each change in the rotational angle θz (yaw) of the wafer table 308 about the Z axis and in the rotational angle θx (pitch) about the X axis. Furthermore, similar to the reference beam 341 (refer to FIG. 12), the measuring beam 340 is reflected twice by the roof mirror 355, and therefore angular deviation in the return direction is prevented even if there is a change in the rotational angle θz and θx of the wafer table 308.

Thus, with the Z axis laser interferometer system 327 of the present embodiment, even if the inclination of the wafer table 308, which is the measurement target, changes, angular deviation of the beams, i.e., the measuring beam 340 and the reference beam 341, that return from the wafer table 308 is prevented. Consequently, the measurement sensitivity with respect to changes in the inclination of the wafer table 308 is low, which suppresses measurement error and the possibility of a failure to detect a change in the attitude of the wafer table 308. Furthermore, with this Z axis laser interferometer system 327, the shifting of the optical axis by the roof mirror 354 maximally shortens the optical path length of the measuring beam 340.

Figure 16:
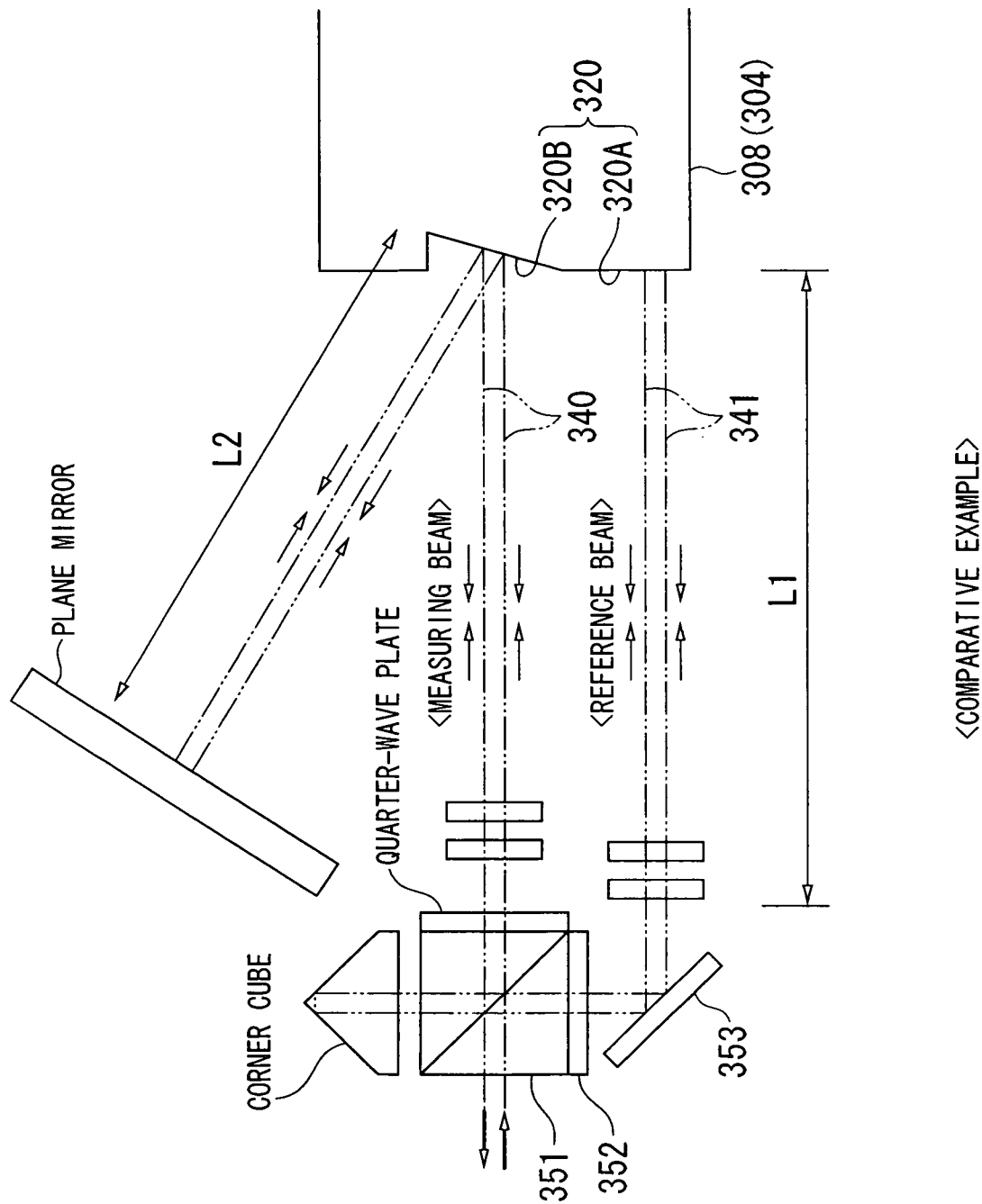
FIG. 16 is for the purpose of explaining how the roof mirror shortens the optical path length, and is a comparative example that is a modification of the arrangement shown in FIG. 13.
Figure 18:
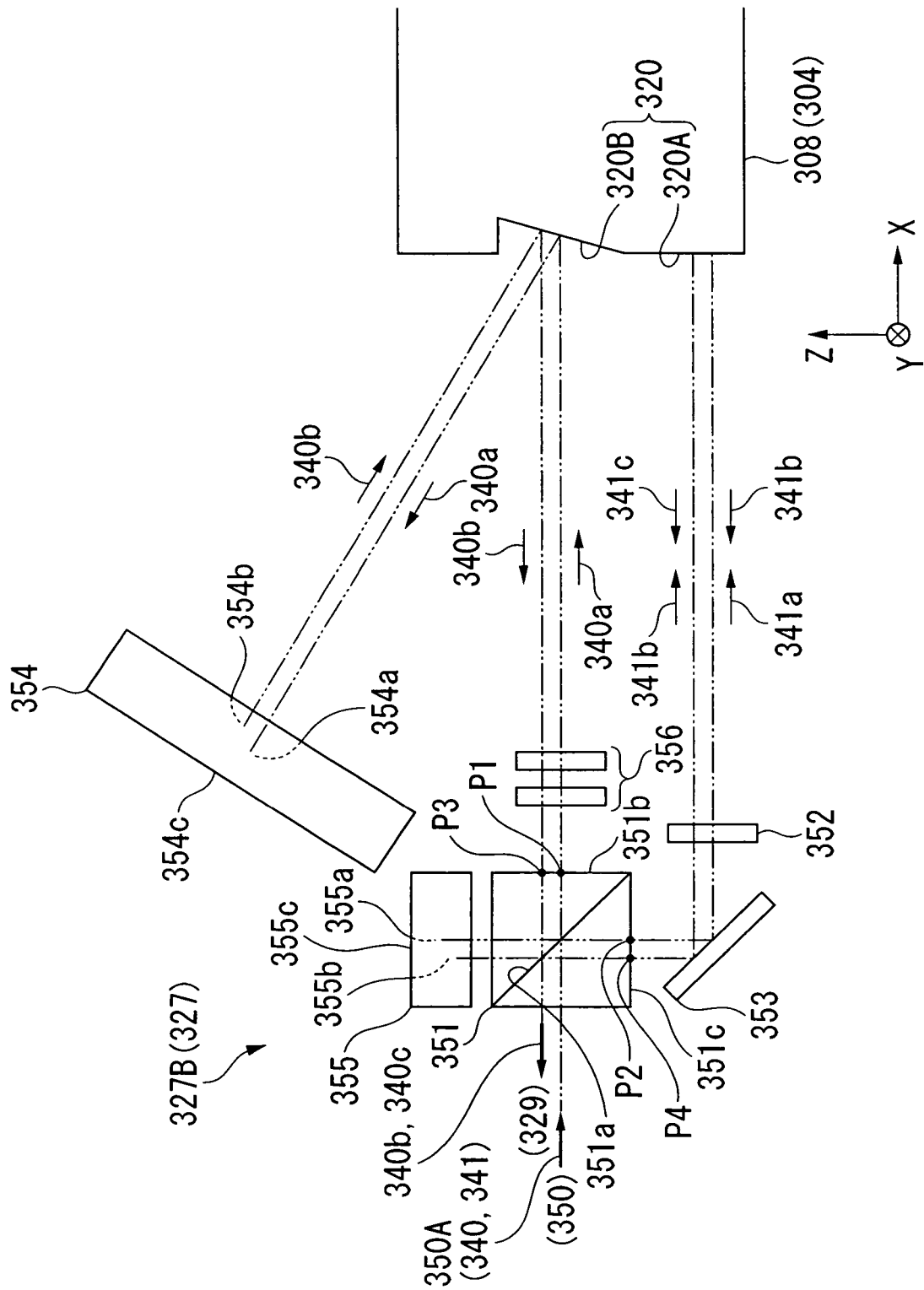
FIG. 18 shows a modified example of FIG. 4.

FIG. 16 is for the purpose of explaining how the use of the roof mirror shortens the optical path length, and is a comparative example that is a modification of the arrangement shown in FIG. 13. Furthermore, to simplify the explanation, constituent elements in FIG. 16 that are identical to those in FIG. 13 are assigned the same symbols.

As shown in FIG. 16, it is possible to constitute the Z axis laser interferometer system 327 in FIG. 13 by substituting the roof mirror with a plane mirror by using, for example, a quarter-wave plate and a corner cube. In this case, the measuring beam 340 makes a total of two round trips between the plane mirror, which serves as a fixed mirror, and the movable mirror 320, and two round trips between the movable mirror 320 and the polarizing beam splitter 351 (optical path length equals approximately $4 \times L1 + 4 \times L2$). In contrast, with the constitution shown in FIG. 13 according to the present embodiment, the use of the roof mirror limits the number of times that the measuring beam 340 is reflected by the movable mirror 320 to two, which makes the optical path length of the measuring beam 340 comparatively short (optical path length equals approximately $2 \times L1 + 2 \times L2$) given that the counts of the abovementioned round trips are one. Furthermore, with the example shown in FIG. 16, the difference between the optical path length of the reference beam 341 (approximately $4 \times L1$) and the optical path length of the measuring beam 340 (approximately $4 \times L1 + 4 \times L2$) is comparatively large; in contrast, with the constitution shown in FIG. 13 according to the present embodiment, the difference between the optical path length of the reference beam 341 (approximately $4 \times L1$) and the optical path length of the measuring beam 340 (approximately $2 \times L1 + 2 \times L2$) is comparatively small.

Returning to FIG. 15, if the inclination of the wafer table 308, which is the measurement target, changes, then a positional deviation dy of the measuring beam 340 returning from the wafer table 308 arises with respect to the reference optical path. The longer the optical path length of the measuring beam 340, the larger the positional deviation dy. As discussed earlier, with the present embodiment, the optical path length of the measuring beam 340 is comparatively short, which suppresses positional deviation of the return measuring beam 340, which is advantageous in that measurement error and the incidence of detection failures are reduced.

In addition, the abovementioned positional deviation dy of the return beam also applies to the reference beam 341 (refer to FIG. 13). Namely, the longer the optical path length of the reference beam 341, the larger the positional deviation of the returned reference beam 341. With the present embodiment, the difference between the optical path length of the reference beam 341 and the optical path length of the measuring beam 340 is comparatively small, and the amount of positional deviations of both beams are comparatively close to one another. Consequently, if there is a change in the inclination of the wafer table 308, which is the measurement target, then the return beam of the measuring beam 340 and the return beam of the reference beam 341 positionally deviate in the same manner, and it is therefore possible to cause both beams to reliably interfere with one another, which is advantageous in that measurement error and the incidence of detection failures are reduced.

The above explained the interferometer optical system 327B in the Z axis laser interferometer system 327, but the same applies for the interferometer optical system 327A (refer to FIG. 1).

Returning to FIG 10, the exposure apparatus EX further comprises a TTR (Through The Reticle) type reticle alignment system sensor RA, which serves as a reticle alignment detection system. In addition, the exposure apparatus EX comprises the FIA (Field Image Alignment) type wafer alignment system sensor WA1, which serves as an off axis type wafer alignment system. Furthermore, the exposure apparatus EX comprises an LSA (Laser Step Alignment) type or an LIA (Laser Interferometric Alignment) type wafer alignment system sensor WA2, which serves as a TTL (Through The Lens) type wafer alignment system.

The reticle alignment system sensor RA irradiates an alignment beam to the reticle 301, which comprises a prescribed mark, and irradiates the fiducial mark area FM, which is provided to a fiducial plane parallel plate WFP on the wafer stage 304, via the projection optical system 303. Furthermore, the reticle alignment system sensor RA receives the light (reflected beam) that emerges from the reticle 301 by the irradiation of the alignment beam as well as the light (reflected beam) that emerges from the fiducial plane parallel plate WFP (fiducial mark area FM) of the wafer stage 304 via the projection optical system 303, and positions the reticle 301.

The FIA off axis type wafer alignment system sensor WA1 is provided to a side part of the projection optical system 303, irradiates the fiducial mark area FM with an alignment beam, which does not pass through the projection optical system 303, that has a wavelength that is different from the exposure light, receives the light that emerges from the FIA mark of the fiducial mark area FM, and derives the baseline amount, which is the relative position of the reticle 301 and the wafer alignment system sensor WA2. This baseline amount forms the reference amount when each of the shot regions on the wafer 305 is disposed within the field of the projection optical system 303.

The LSA or the LIA type wafer alignment system sensor WA2 receives the light that emerges from the LSA mark or the LIA mark formed in the fiducial mark area FM by the irradiation of the alignment beam, and derives a reference for the positional measurement of the wafer 305. Furthermore, an LSA type alignment system is disclosed in detail in, for example, Japanese Published Unexamined Patent Application No. S60-130742 (corresponding U.S. Pat. No. 4,677, 301). In addition, the LIA type alignment system is disclosed in detail in, for example, Japanese Published Unexamined Patent Application No. S61-215905 (corresponding U.S. Pat. No. 4,710,026).

Continuing, the exposure operation of the exposure apparatus EX provided with the constitution discussed above will now be explained simply.

First, a preparatory operation is performed under the control of the main control system 317 prior to the exposure operation. Specifically, a plurality of slit beams is projected from the focal point position detection system sensor 310a, 310b to the fiducial plane parallel plate WFP, and an offset adjustment (origin adjustment) is performed for each of the plurality of slit beams. After various exposure conditions have been set, the reticle alignment system sensor RA is used to perform reticle alignment, as needed. In addition, the wafer alignment system sensor WA1 is used perform baseline measurement. Furthermore, the wafer alignment system sensors WA1, WA2 are used to perform, for example, fine alignment (enhanced global alignment, i.e., EGA) of the wafer 305. Thereby, the array coordinates of each of the plurality of shot regions on the wafer 305 are derived.

When the alignment procedure discussed above ends, the main control system 317 instructs the drive control unit 318 to drive the wafer stage 304 to the exposure position of the first shot (first shot region) of the wafer 305 while monitoring the measurement values of the X axis laser interferometer system 325 and the Y axis laser interferometer system 326 on the wafer 305 side based on the alignment results. A procedure (focusing) is performed under the control of the main control system 317 that projects a plurality of slit beams from the focal point position detection system sensor 310a, 310b to the wafer 305, drives the actuators 309a, 309b, 309c of the wafer table 308, and aligns the imaging plane of the circuit pattern of the reticle 301 with the exposure surface of the wafer 305.

When this preparatory operation ends, the pattern area of the reticle 301 is illuminated with the exposure light, which thereby ends the exposure of the first shot region on the wafer 305. Thereby, the circuit pattern of the reticle 301 is reduction transferred onto the resist layer of the first shot region on the wafer 305 through the projection optical system 303.

When the exposure of this first shot region ends, the main control system 317 steps the wafer stage 304 in the X and Y axial directions, and moves it to the exposure position of the second shot region. Namely, a stepping operation is performed between the shots. The Z axis laser interferometer system 327 is used as needed when performing this stepping operation. The exposure of the second shot region is performed similarly. In so doing, the exposure of a shot region on the wafer 305 and the stepping operation in order to expose the next shot region are performed repetitively, and the circuit pattern of the reticle 301 is thereby sequentially transferred onto all exposure target shot regions on the wafer 305.

FIG. 17 explains an aspect wherein the interferometer optical systems 325A, 325B are switched in the X axis laser interferometer system 325, and an aspect wherein the interferometer optical systems 327A, 327B are switched in the Z axis laser interferometer system 327.

As shown in FIG. 17, the X axis laser interferometer system 325 measures the positional information of the wafer stage 304 (wafer table 308) in the X axial direction at two locations. Namely, the interferometer optical system 325A is used to measure the X coordinate of the wafer table 308 when performing the exposure process through the projection optical system 303, and the interferometer optical system 325B is used to measure the X coordinate of the wafer table 308 when measuring a mark on the wafer stage 304 or the wafer 305 through the wafer alignment system sensor WA1. Likewise, the Z axis laser interferometer system 327 is used to measure the positional information of the wafer stage 304 (wafer table 308) in the Z axial direction at two locations. Namely, the interferometer optical system 327A is used to measure the Z coordinate of the wafer table 308 when performing the exposure process through the projection optical system 303, and the interferometer optical system 325B is used to measure the Z coordinate of the wafer table 308 when measuring a mark on the wafer stage 304 or the wafer 305 through the wafer alignment system sensor WA1.

In the Z axis laser interferometer system 327 of the present embodiment discussed above, the measurement sensitivity with respect to changes in the attitude of the wafer table 308 decreases, which makes it possible to reduce measurement error and the incidence of detection failures, as well as to achieve high precision positional measurement. Consequently, the positioning of the wafer table 308 (wafer stage 304) in the stepping operation becomes accurate, and a high precision exposure process is thereby achieved.

FIG. 18 through FIG. 21 show modified examples of FIG. 13. Furthermore, in each of these figures, constituent elements that are identical to those in FIG. 13 are assigned identical symbols in order to simplify the explanation.

With the previous example shown in FIG. 13, the quarter-wave plate 352 for the reference beam 341 is disposed between the polarizing beam splitter 351 and the bending mirror 353 and proximate to the polarizing beam splitter 351 (or bonded to the second surface 351c). Moreover, with the example shown in FIG. 18, the quarter-wave plate 352 for the reference beam 341 is disposed between the bending mirror 353 and the movable mirror 320 and spaced apart from the polarizing beam splitter 351. In addition, with the example shown in FIG. 18, the adjustment mechanism 356 for adjusting the optical axis of the beams is disposed along the optical path of the measuring beam 340, and not along the optical path of the reference beam 341.

Figure 19:
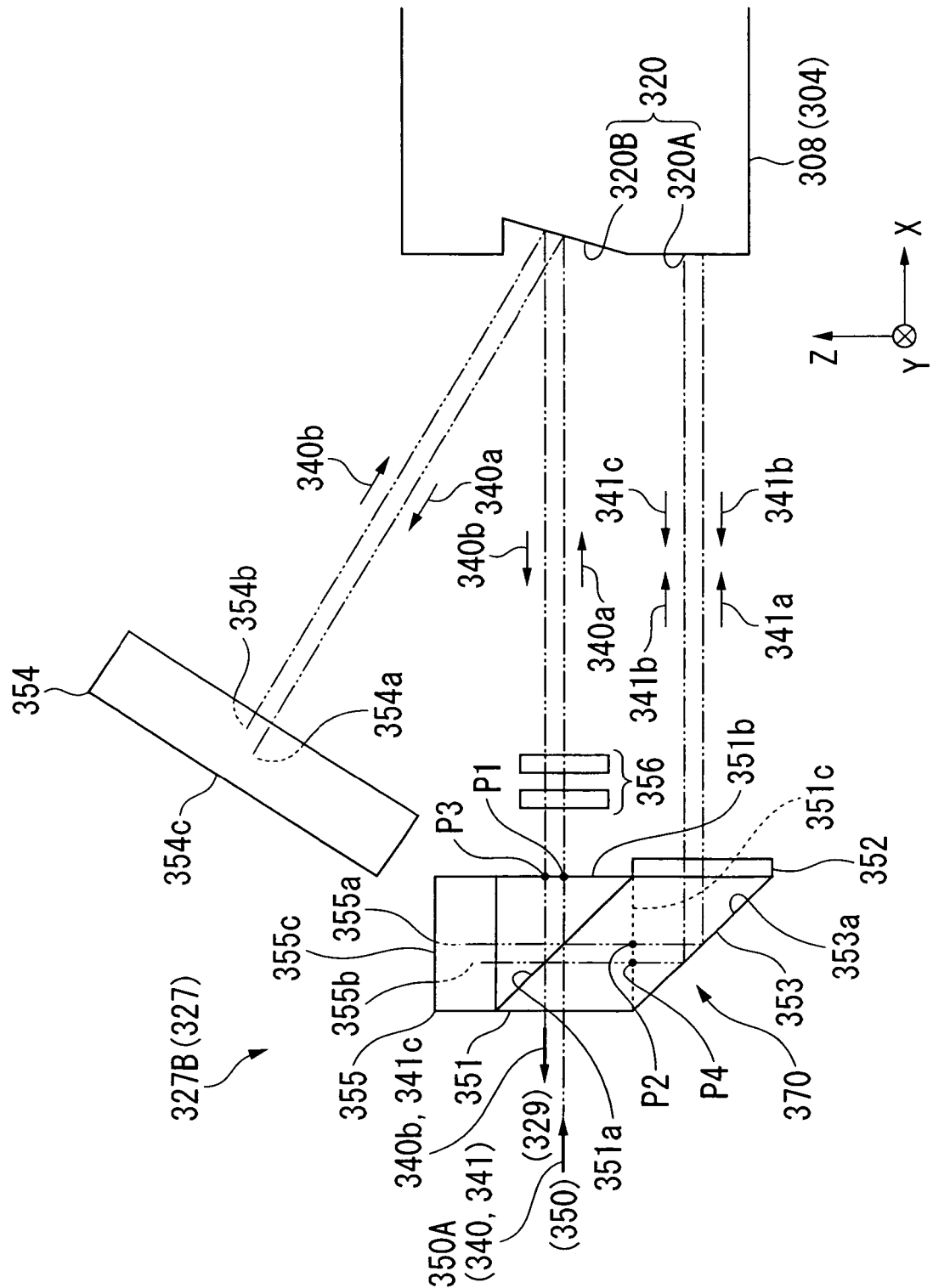
FIG. 19 shows a modified example of FIG. 4.

With the example in FIG. 19, the polarizing beam splitter 351, the bending mirror 353, the quarter-wave plate 352, and the roof mirror 355 are integrated. Namely, an integrated member 370 comprises the polarizing surface 351a, a reflecting mirror 353a for bending, the two reflecting surfaces 355a, 355b that form a narrow angle of 90° between one another, and the quarter-wave plate 352, which serves as a polarization switching member. In addition, in the example in FIG. 19, the adjustment mechanism 356 for adjusting the optical axis of the beams is disposed along the optical path of the measuring beam 340, and not along the optical path of the reference beam 341.

Furthermore, with the constitution shown in FIG. 19, the optical path length of the reference beam 341 that passes through the interior of the member 370 is longer than that of the measuring beam 340. Accordingly, for example, a block, which is made of a material that is the same as the member 370 and forms one part of the optical path of the measuring beam 340, may be provided on the first surface 351b side of the polarizing beam splitter 351, and the optical path length of the measuring beam 340 inside this block may be set appropriately; thereby, the member 370 of the measuring beam 340 and the reference beam 341, and the optical path lengths inside the block may be set so that they are equal.

Figure 20:
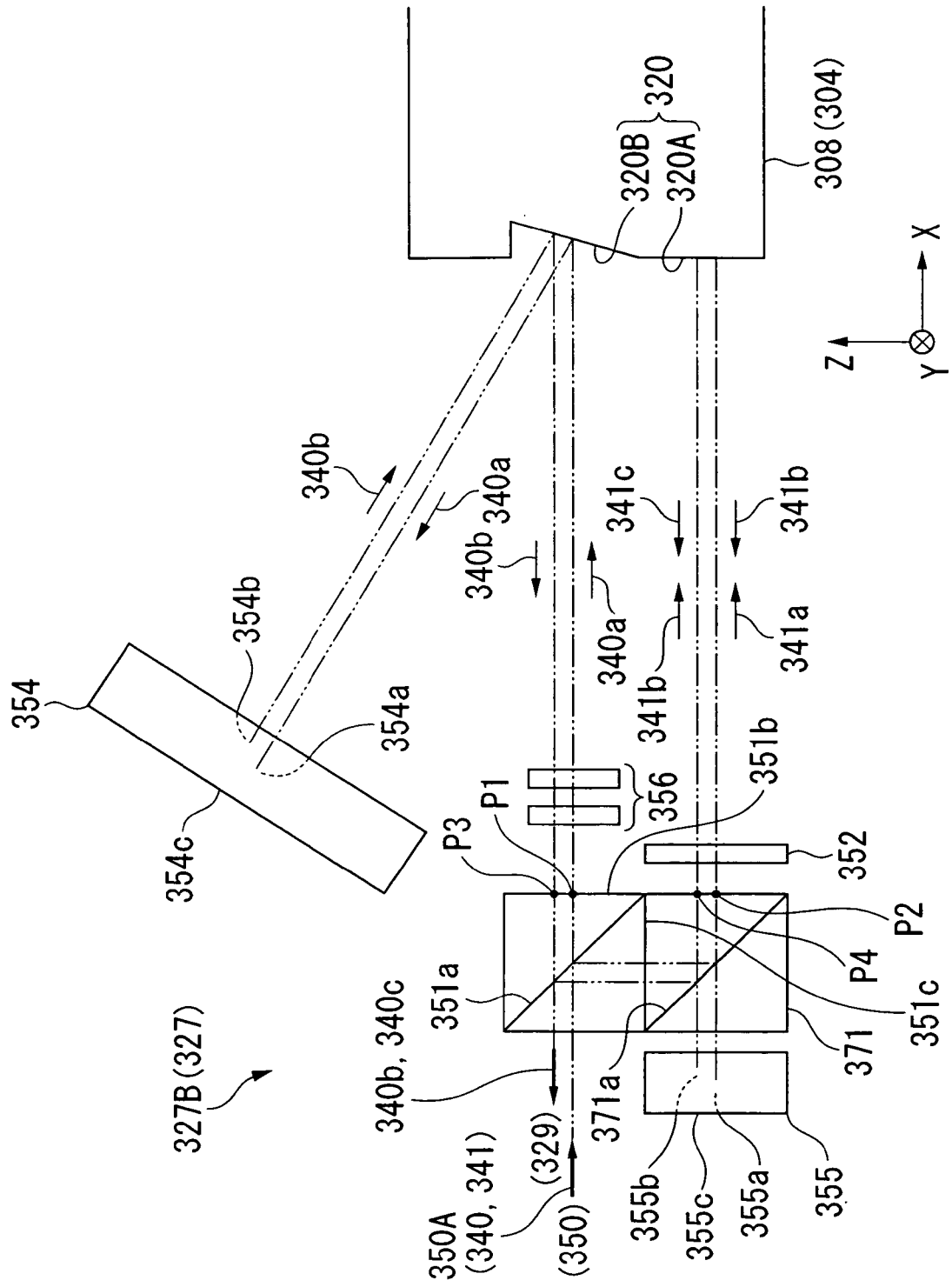
FIG. 20 shows a modified example of FIG. 4.

The example shown in FIG. 20 has a constitution wherein two polarizing beam splitters are combined. Namely, a second polarizing beam splitter 371 is provided and arranged proximate to the second surface 351c, which is the surface of the first polarizing beam splitter 351 that the reference beam 341 passes through. The second polarizing beam splitter 371 comprises a polarizing surface 371a, which is disposed spaced apart and parallel to the polarizing surface 351a of the first polarizing beam splitter 351 in the −Z direction. The roof mirror 355 (or the roof prism) is disposed at the destination of the return reference beam 341 that transmits through the polarizing surface 371a.

Figure 21:
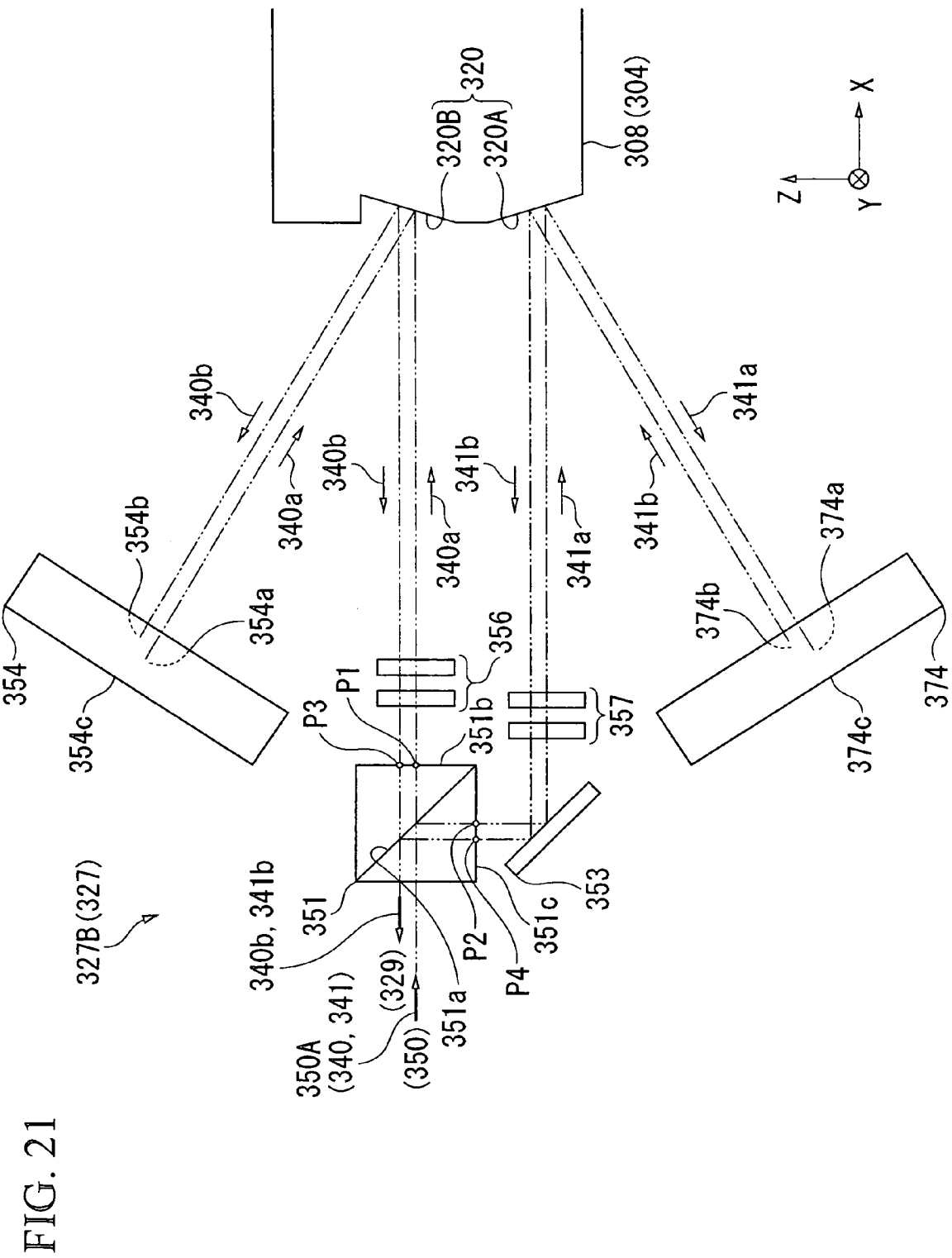
FIG. 21 shows a modified example of FIG. 4.

In the example shown in FIG. 21, a roof mirror 374 for the reference beam 341 is disposed at a position so that it is symmetric to the roof mirror 354 for the measuring beam 340 and so that the XY plane is interposed therebetween. The measuring beam 340 reflected by the movable mirror 320 proceeds diagonally upward toward the roof mirror 354, and the reference beam 341 reflected by the movable mirror 320 proceeds diagonally downward toward the roof mirror 374.

Specifically, as shown in FIG. 21, the measuring beam 340, which is the P polarized light component, of the laser beam 350A from the laser light source 350 transmits through the polarizing surface 351a of the polarizing beam splitter 351, proceeds in the +X direction, and emerges (as the measuring beam 340a) from the emergent position P1 at the first surface 351b. Meanwhile, the reference beam 341, which is the S polarized light component, is reflected and bent by the polarizing surface 351a of the polarizing beam splitter 351, proceeds in the −Z direction, and emerges (as the reference beam 341a) from the emergent position P2 at the second surface 351c.

The movable mirror 320, which is provided to the wafer stage 304 (wafer table 308), comprises a second reflecting surface 320B, which is disposed parallel to the Y axis and inclined with respect to the YZ plane, and a third reflecting surface 320C, which is disposed parallel to the Y axis and inclined with respect to the YZ plane on the side opposite the second reflecting surface 320B. The measuring beam 340a from the polarizing beam splitter 351 is irradiated to the second reflecting surface 320B of the movable mirror 320, is bent at a prescribed angle thereby, and then proceeds diagonally upwards in the −X direction, the same as in FIG. 13. The measuring beam 340a enters the photoelectric conversion device 329 via the same route as in FIG. 13.

Meanwhile, the reference beam 341a from the polarizing beam splitter 351 is irradiated to the third reflecting surface 320C of the movable mirror 320, is bent at a prescribed angle thereby, and then proceeds diagonally downward in the −X direction. The roof mirror 374 is provided and disposed at the destination of the reference beam 341a, which was reflected by the third reflecting surface 320C of the movable mirror 320. The roof mirror 374 is disposed spaced apart from the polarizing beam splitter 351 at a lower position (in the −Z direction). Further, the roof mirror 374 is shaped the same as the roof mirror 354 for the measuring beam (refer to FIG. 14A-14C), and comprises two reflecting surfaces 374a, 374b that form a narrow angle of 90° between them. A line of intersection 374c of these two reflecting surfaces 374a, 374b lies within the XZ plane and is perpendicular to the travel direction of the reference beam 341a reflected by the movable mirror 320 (third reflecting surface 320C). Furthermore, attendant with the movement of the wafer stage 304 (wafer table 308) in the X direction as well as in the Z direction, the irradiation position of the reference beam 341a with respect to the roof mirror 374 changes to the abovementioned line of intersection direction. The length to which the roof mirror 374 extends in the abovementioned line of intersection direction is determined based on the range of motion of the wafer stage 304 (wafer table 308) in the X direction.

The reference beam 341a that enters the roof mirror 374 returns from the roof mirror 374 to the movable mirror 320 via the retroreflection that is attendant with the shift in its optical axis. Specifically, the reference beam 341a from the movable mirror 320 is bent 90° by the reflecting surface 374a of the roof mirror 374, proceeds in the +Y direction, and impinges upon the reflecting surface 374b. The reference beam 341a is bent 90° by the reflecting surface 374b, and proceeds diagonally upward in the +X direction toward the movable mirror 320 (as a reference beam 341b). The reference beam 341a that impinges upon the roof mirror 374 and the reference beam 341b that emerges from the roof mirror 374 are parallel, and the optical axis of the emergent beam is shifted in the +Y direction parallel to the optical axis of the incident beam. Namely, the reference beam 341a from the movable mirror 320 is reflected twice by the roof mirror 374, which shifts its optical axis (optical path) in the +Y direction, i.e., the direction in which the two reflecting surfaces 374a, 374b intersect the line of intersection 374c, and then returns to the movable mirror 320.

The reference beam 341b from the roof mirror 374 is bent at a prescribed angle by the third reflecting surface 320C of the movable mirror 320, and proceeds in the −X direction. The reference beam 341b is bent 90° by the bending mirror 353, proceeds in the +Z direction, and then impinges upon the second surface 351c of the polarizing beam splitter 351. Furthermore, the emergent position P4 of the reference beam 341b that returns from the movable mirror 320 is different than the emergent position P2 of the reference beam 341a at the second surface 351c of the polarizing beam splitter 351. Namely, P4 is shifted in the +Y direction with respect to P2. The reference beam 341b that enters the polarizing beam splitter 351 is reflected and bent by the polarizing surface 351a, proceeds in the −X direction, and then enters the photoelectric conversion device 329. The photoelectric conversion device 329 measures the amount of positional fluctuation of the wafer table 308 in the Z direction based on the interference light of the measuring beam 340b and the reference beam 341b, which are both return beams.

With the example shown in FIG. 21, the roof mirror 374, which is a fixed mirror for the reference beam 341, is disposed at a position so that it is symmetric to the roof mirror 354, which is a fixed mirror for the measuring beam 340, and so that the XY plane is interposed therebetween, and it is therefore possible to measure the amount of positional fluctuation of the wafer table 308 in the Z direction with high sensitivity. Namely, in the present example, the amount of relative change between the optical path length of the measuring beam 340 and the optical path length of the reference beam 341 is comparatively large with respect to the movement of the wafer table 308 in the Z direction, and it is therefore possible to detect fine positional fluctuations of the wafer table 308 with high precision.

In addition, with the present example, the optical path length of the reference beam 341 and the optical path length of the measuring beam 340 are substantially the same, and the amount of positional deviations of both beams are substantially equal when the inclination of the wafer table 308 changes. Consequently, even if there is a change in the inclination of the wafer table 308, which is the measurement target, each of the return beams of the measuring beam 340 and the reference beam 341 positionally deviate in the same manner, and it is therefore possible to reliably cause both beams to interfere with one another and thereby to reduce measurement error and the incidence of detection failures. Furthermore, as shown in the figure, the interferometer optical members, which comprise, for example, the polarizing beam splitter 351, the beam optical axis adjusting mechanisms 356, 357, and the bending mirror 353, are at a position further from the wafer table 308 than from the roof mirrors 354, 374, which are fixed mirrors, and it is therefore possible to make the air conditioning environment of the beams 340, 341 equivalent even after the beams 340, 341 are reflected by the movable mirror 320 and separate vertically, which reduces measurement error due to air fluctuations.

Figure 22A:
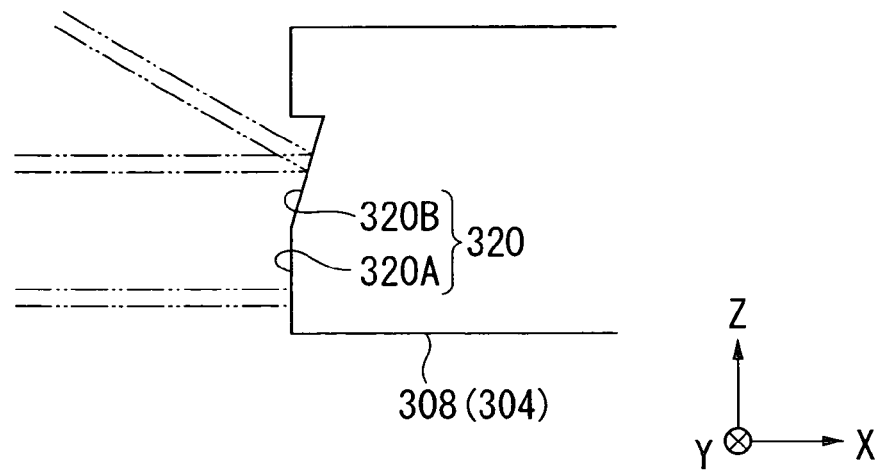
FIGS. 22A, 22B, and 22C show embodiments of the movable mirror.
Figure 22B:
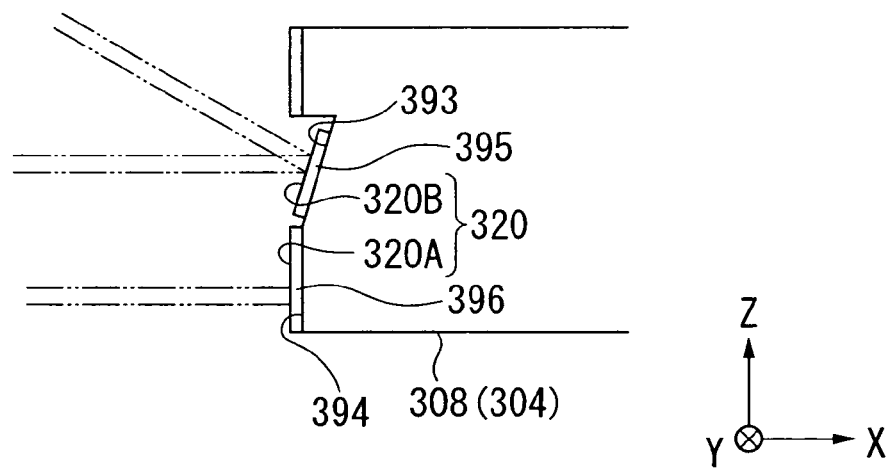
Figure 22C:
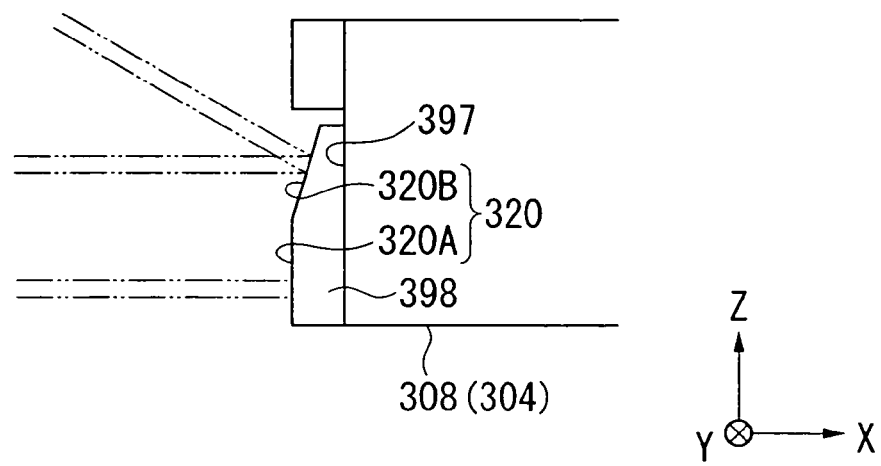

FIG. 22A-22C show embodiments of the movable mirror 320 provided to the wafer table 308 (wafer stage 304).

In the example shown in FIG. 22A, the reflecting surfaces 320A, 320B are formed on the side surface of the wafer table 308 by processing such. The reflecting surface 320A is parallel to the YZ plane, and the reflecting surface 320B is parallel to the Y axis and inclined with respect to the YZ plane.

The reflecting surfaces 320A, 320B can be formed by mirror surface processing, or by forming a reflecting film on a polished surface.

With the example shown in FIG. 22B, an inclined surface 393, which is parallel to the Y axis and inclined with respect to the YZ plane, is formed in the side surface of the wafer table 308, and a reflecting mirror 395, which comprises the reflecting surface 320B, is provided and fixed to this inclined surface 393. In addition, a surface 394, which is parallel to the YZ plane, is formed in the side surface of the wafer table 308, and a reflecting mirror 396, which comprises the reflecting surface 320A, is provided and fixed to this surface 394.

With the example shown in FIG. 22C, a surface 397, which is parallel to the YZ plane, is formed in the side surface of the wafer table 308, and a reflecting member 398, which comprises the reflecting surfaces 320A, 320B, is provided and disposed on this surface 397. The reflecting surface 320A is parallel to the YZ plane, and the reflecting surface 320B is parallel to the Y axis and inclined with respect to the YZ plane.

Furthermore, the exposure apparatus EX can also be adapted to a step-and-scan type exposure apparatus (so-called scanning stepper) that transfers the pattern of a mask to each of the shot regions on a substrate while synchronously moving the mask (reticle) and the substrate (wafer) in a one dimensional direction. In addition, the exposure apparatus EX can also be adapted to a step-and-stitch type exposure apparatus that partially and superposingly transfers at least two patterns onto the wafer W. In addition, the exposure apparatus EX can also be adapted to a proximity exposure apparatus that brings a mask and a substrate into close contact and exposes the pattern of the mask without the use of a projection optical system.

In addition, the exposure apparatus EX can also be adapted to an immersion exposure apparatus. Such an immersion exposure apparatus, e.g., a system that locally fills a liquid between a projection optical system and a substrate, is known and is disclosed in PCT International Publication WO 2004/053958. In addition, the exposure apparatus EX can also be adapted to an immersion exposure apparatus that moves a stage, which holds a substrate to be exposed, in a liquid bath, and to an immersion exposure apparatus that forms a liquid layer of a prescribed thickness on a stage and holds a substrate therein.

In addition, the exposure apparatus EX can also be adapted to an exposure apparatus that comprises a movable exposure stage that holds a substrate, such as a wafer, to be processed, and a measurement stage, which is equipped with, for example, various measuring members and sensors, as disclosed in Japanese Published Unexamined Patent Application No. 11-135400 (corresponding PCT International Publication WO 1999/23692).

Furthermore, the operational procedure as well as the various shapes and combinations of the constituent members described in each of the abovementioned embodiments are merely exemplary, and the specific constitution is not limited to these embodiments; further, it is understood that variations and modifications based on, for example, process conditions and design requirements may be effected without departing from the spirit and scope of the invention.

Furthermore, the substrate held by the movable stage in each of the abovementioned embodiments is not limited to a semiconductor wafer for fabricating semiconductor devices, but can also be adapted to, for example, a glass substrate for a display device, a ceramic wafer for a thin film magnetic head, or a mask or the original plate of a reticle (synthetic quartz, silicon wafer) used by an exposure apparatus.

The type of exposure apparatus is not limited to semiconductor device fabrication exposure apparatuses that expose the pattern of a semiconductor device on a wafer, but can also be widely adapted to, for example, exposure apparatuses for fabricating liquid crystal display devices or displays, or exposure apparatuses for fabricating thin film magnetic heads, imaging devices (CCDs), or reticles and masks.

The present invention can also be adapted to a twin stage type exposure apparatus, wherein a plurality of wafer stages is provided. The structure and exposure operation of a twin stage type exposure apparatus is disclosed in, for example, Japanese Published Unexamined Patent Application No. H10-163099, Japanese Published Unexamined Patent Application No. H10-214783 (corresponding U.S. Pat. Nos. 6,341,007, 6,400,441, 6,549,269 and 6,590,634), Published Japanese Translation No. 2000-505958 of the PCT International Publication (corresponding U.S. Pat. No. 5,969,441), or U.S. Pat. No. 6,208,407. Furthermore, the present invention may be adapted to the wafer stage disclosed in Japanese Patent Application No. 2004-168481 (corresponding PCT International Publication WO 2005/122242), which was previously filed by the present applicant.

Furthermore, each of the embodiments discussed above used either a light transmitting type mask, which forms a prescribed shielding pattern (or a phase pattern, or a dimming pattern) onto a substrate that has light transmitting characteristics, or a light reflection type mask, which forms a prescribed reflected pattern onto a substrate that has light reflection properties, but the present invention is not limited thereto. For example, instead of such a mask, an electronic mask (which is one type of optical system) may be used that forms a transmitted pattern, a reflected pattern, or a light emitting pattern, based on digital data of the pattern to be exposed. Such an electronic mask is disclosed in, for example, U.S. Pat. No. 6,778,257.

In addition, the present invention can also be adapted to an exposure apparatus that, for example, performs an exposure that is called a double beam interference exposure and exposes a substrate with the interference fringes produced by the interference of a plurality of light beams. Such an exposing method and an exposure apparatus are disclosed in, for example, PCT International Publication WO 01/35168.

In addition, a KrF excimer laser (248 nm), an ArF excimer laser (193 nm), an $F_2$ laser (157 nm), as well as a g line (436 nm) and i line (365 nm) light source can be used as the light source of the exposure apparatus to which the present invention is adapted. Furthermore, the magnification of the projection optical system is not limited to a reduction system, but may also be a unity magnification system or an enlargement system.

If a linear motor is used in the wafer stage or the reticle stage (refer to U.S. Pat. No. 5,623,853 and U.S. Pat. No. 5,528,118), then either an air levitation type that uses an air bearing, or a magnetic levitation type that uses Lorentz's force or reactance force may be used. In addition, each of the stages WST, RST may be a type that moves along a guide or may be a guideless type.

For the drive mechanism of each of the stages, a planar motor may be used that opposes a magnet unit, wherein magnets are disposed two dimensionally, to an armature unit, wherein coils are disposed two dimensionally, and drives each of the stages by electromagnetic force. In this case, either the magnet unit or the armature unit is connected to the stages and the other one should be provided on the plane of motion side of the stages.

The reaction force generated by the movement of the wafer stage may be mechanically discharged to the floor (ground)

by using a frame member so that it is not transmitted to the projection optical system, as recited in Japanese Published Patent Application No. H08-166475 (corresponding U.S. Pat. No. 5,528,118).

The reaction force generated by the movement of the reticle stage may be mechanically discharged to the floor (ground) using a frame member, as disclosed in Japanese Published Unexamined Patent Application No. H8-330224 (corresponding U.S. Pat. No. 5,874,820).

Furthermore, like the movable mirrors 30, 60, the fixed mirrors 31A and 31B, 61A and 61B, 354, and 374 may be supported by the support body via hinge blocks, which comprise a kinematic mount mechanism.

In addition, the exposure apparatus to which the present invention is adapted is manufactured by assembling various subsystems, including each constituent element recited in the claims of the present application, so that prescribed mechanical, electrical, and optical accuracies are maintained. To ensure these various accuracies, adjustments are performed before and after this assembly, including an adjustment to achieve optical accuracy for the various optical systems, an adjustment to achieve mechanical accuracy for the various mechanical systems, and an adjustment to achieve electrical accuracy for the various electrical systems. The process of assembling the exposure apparatus from the various subsystems includes, for example, the mutual mechanical connection, the wiring and connection of electrical circuits, and the piping and connection of the atmospheric pressure circuit of the various subsystems. Of course, before the process of assembling the exposure apparatus from these various subsystems, there are also the processes of assembling each individual subsystem. When the process of assembling the exposure apparatus from the various subsystems is finished, a comprehensive adjustment is performed to ensure the various accuracies of the exposure apparatus as a whole. Furthermore, it is preferable to manufacture the exposure apparatus in a clean room wherein, for example, the temperature and the cleanliness level are controlled.

Figure 23:
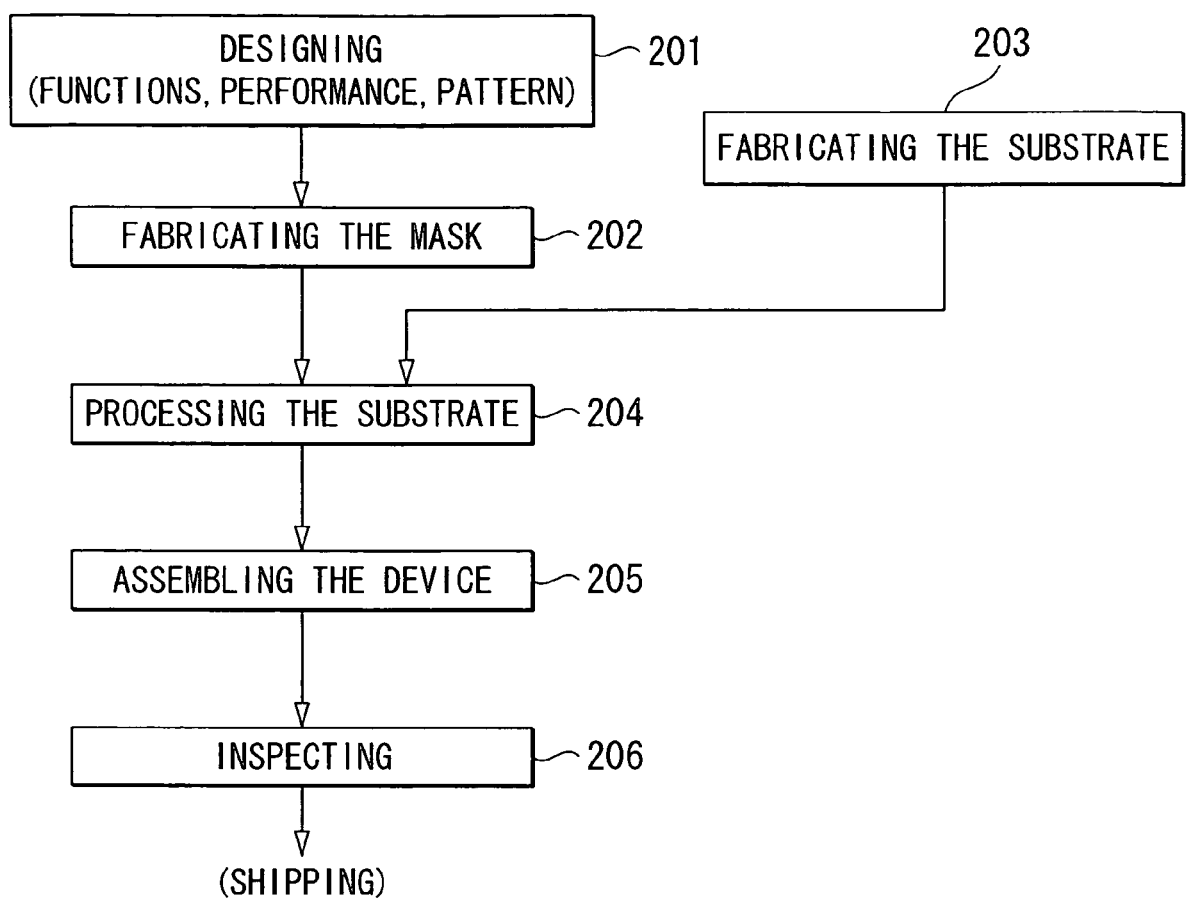
FIG. 23 is a flow chart diagram that depicts one example of a process of fabricating a semiconductor device.

In addition, as shown in FIG. 23, a micro-device, such as a semiconductor device, is manufactured by, for example: a step 201 that designs the functions and performance of the micro-device; a step 202 that fabricates a mask (reticle) based on this design step; a step 203 that fabricates a substrate, which is the base material of the device; a step 204 that includes substrate treatment processes, such as the process of exposing the pattern of the mask onto the substrate by using the exposure apparatus EX of the embodiments discussed above, a process that develops the exposed substrate, and a process that heats (cures) and etches the developed substrate; a device assembling step 205 (comprising fabrication processes, such as a dicing process, a bonding process, and a packaging process); and an inspecting step 206.

Furthermore, each disclosure of every Japanese published patent application and U.S. patent related to the exposure apparatus recited in each of the abovementioned embodiments, modified examples, and the like is hereby incorporated by reference in its entirety to the extent permitted by the national laws and regulations of the designated states (or elected states) designated by the present international patent application.

According to the present invention, it is possible to dispose various equipment without hindrance and to detect the positions of movable stages while avoiding an increase in the size of the apparatus. According to an interferometer system of the present invention, it is possible to reduce measurement error as well as the incidence of detection failures, and to achieve high precision positional measurement while reducing the measurement sensitivity with respect to the attitude of a movable body. An optical member of the present invention can be favorably used in an interferometer that has a function that reduces measurement error and the incidence of detection failures with respect to changes in the attitude of the movable body. According to stage apparatuses of the present invention, it is possible to improve the positioning accuracy of the stages. Therefore, the present invention is extremely useful in an exposure apparatus and method for manufacturing a wide range of products, e.g., semiconductor devices, liquid crystal display devices, displays, thin film magnetic heads, CCDs, micromachines, MEMS, DNA chips, and reticles (masks).

What is claimed is:

1. A measuring system, comprising:
a measuring apparatus that projects measuring beams;
a first reflecting surface on a body provided on an object, a normal line of the first reflecting surface extending in a first predetermined direction that includes a component of the Z axial direction;
a second reflecting surface on the body, a normal line of the second reflecting surface extending in a second predetermined direction that includes a component of the Z axial direction, the first reflecting surface and the second reflecting surface being substantially symmetric with respect to the Y axial direction; and
a third reflecting surface on the body, a normal line of the third reflecting surface extending in the Y axial direction,
the measuring apparatus (1) projecting a first measuring beam along the Y axial direction toward the first reflecting surface and a second measuring beam along the Y axial direction toward the second reflecting surface and (2) obtaining positional information, in the Z axial direction, or in the Y and Z axial directions, of the object on which the body is provided by receiving reflected first and second measuring beams, and (3) projecting a third measuring beam along the Y axial direction toward the third reflecting surface and (4) obtaining positional information, in the Y axial direction, of the object by receiving a reflected third measuring beam, wherein
the third reflecting surface is provided between the first reflecting surface and the second reflecting surface.

2. A measuring system according to claim 1, wherein
the object contains a fourth reflecting surface separate from the body,
the object rotates about the X axial direction, and
the measuring apparatus detects an amount of pitching of the object about the X axial direction based on positions of the fourth reflecting surface and the third reflecting surface.

3. A measuring apparatus that obtains positional information of a movable member that moves in a plane defined by a first axis and a second axis that is orthogonal to the first axis, the measurement apparatus comprising:
a first optical member for a first optical path, the first optical path including a component in a first axial direction along the first axis and a component in a third axial direction along a third axis that is orthogonal to the plane, the first optical member directing a first beam to the movable member along the first axial direction, the first beam reflecting from the movable member traveling in the first optical path;
a second optical member for a second optical path, the second optical path including a component in the first axial direction and a component in the third axial direction and being different from the first optical path, the second optical member directing a second beam to the movable member along the first axial direction, the second beam reflecting from the movable member traveling in the second optical path;

a third optical member for a third optical path, the third optical path including a component in the first axial direction and being different from the first and the second optical paths, the third optical member directing a third beam to the movable member along the first axial direction, the third beam reflecting from the movable member traveling in the third optical path;

an interferometer at which the first beam having traveled over the first optical path and the second beam having traveled over the second optical path are interfered with each other; and a calculating apparatus that acquires positional information of the movable member in the third axial direction based on the interference at the interferometer, wherein an incident path of the third beam toward the movable member along the first axial direction positions in the third axial direction between that of the first beam and that of the second beam.

4. The measuring apparatus according to claim 3, wherein the calculating apparatus acquires positional information in the first axial direction of the movable member based on the third beam having traveled over the third optical path.

5. The measuring apparatus according to claim 3, wherein the calculating apparatus acquires positional information in a rotational direction about the second axis of the movable member based on the third beam having traveled over the third optical path.

6. The measuring apparatus according to claim 3, further comprising:

a fourth optical member for a fourth optical path, the fourth optical path including a component in the first axial direction and being different from the first, the second, and the third optical paths, the fourth optical member directing a fourth beam to the movable member along the first axial direction, the fourth beam reflecting from the movable member traveling in the fourth optical path, wherein the calculating apparatus acquires positional information in a rotational direction about the second axis of the movable member based on the third and the fourth beams having traveled over the third or the fourth optical paths.

7. The measuring apparatus according to claim 3, wherein the first optical member or the second optical member has a source from which the first beam or the second beam emit.

8. The measuring apparatus according to claim 7, wherein the source also emits the third beam.

9. The measuring apparatus according to claim 3, wherein the first optical member has a first reflecting surface that is provided on the movable member and reflects the first beam traveling in the first optical path, the second optical member has a second reflecting surface that is provided on the movable member and reflects the second beam traveling in the second optical path, and the third optical member has a third reflecting surface that is provided on the movable member and reflects the third beam traveling in the third optical path, the third reflecting surface being between the first reflecting surface and the second reflecting surface.

10. A stage apparatus comprising:
a holding member that can move while holding an object; and
a measuring apparatus according to claim 3, that obtains positional information of the holding member as the movable member.

11. A measuring method of obtaining positional information of a movable member in a plane of motion defined by a first axis and a second axis orthogonal to the first axis, the method comprising:

providing a first beam, the first beam being incident on the movable member along a first axial direction along the first axis and being reflected from the movable member, the first beam from the movable member traveling in a first optical path, the first optical path including a first component being in the first axial direction and a third component being in a third axial direction along a third axis that is orthogonal to the plane;

providing a second beam, the second beam being incident on the movable member along the first axial direction and being reflected from the movable member, the second beam from the movable member traveling in a second optical path, the second optical path including the first component and the third component and being different from the first optical path;

providing a third beam, the third beam being incident on the movable member along the first axial direction and being reflected from the movable member, the third beam from the movable member traveling in a third optical path, the third optical path including the first component and being different from the first and the second optical paths; and acquiring positional information of the movable member in the third axial direction based on the first beam having traveled over the first optical path and the second beam having traveled over the second optical path, wherein an incident path of the third beam toward the movable member positions in the third axial direction between that of the first beam and that of the second beam.

12. The method according to claim 11, further comprising:
providing a fourth beam, the fourth beam being incident on the movable member along the first axial direction and being reflected from the movable member, the fourth beam from the movable member traveling in a fourth optical path, the fourth optical path including the first component and being independent of the first, the second, and the third optical paths; and acquiring positional information of the movable member in a rotational direction about the second axis based on positional information of the movable member in the first axial direction using the third beam and based on the fourth beam having traveled over the fourth optical path.

13. The method according to claim 11,
wherein the first beam having traveled over the first optical path and the second beam having traveled over the second optical path are interfered with each other.

* * * * *